(12) United States Patent
Ogawa et al.

(10) Patent No.: US 7,306,423 B2
(45) Date of Patent: Dec. 11, 2007

(54) LINEAR MOVING MECHANISM AND TRANSFER ROBOT USING THE SAME

(75) Inventors: Hironori Ogawa, Osaka (JP); Takafumi Uratani, Osaka (JP); Masayuki Sugane, Osaka (JP); Yoshiyuki Matsuzaki, Osaka (JP); Naoya Murata, Osaka (JP); Sakiko Uno, Osaka (JP)

(73) Assignee: Daihen Corporation, Osaka (JP)

( * ) Notice: Subject to any disclaimer, the term of this patent is extended or adjusted under 35 U.S.C. 154(b) by 149 days.

(21) Appl. No.: 10/825,267

(22) Filed: Apr. 14, 2004

(65) Prior Publication Data

US 2005/0036877 A1    Feb. 17, 2005

(30) Foreign Application Priority Data

Apr. 16, 2003 (JP) ............................. 2003-111967
Sep. 30, 2003 (JP) ............................. 2003-341137
Feb. 27, 2004 (JP) ............................. 2004-052902

(51) Int. Cl.
*B25J 18/02* (2006.01)

(52) U.S. Cl. ............................. 414/749.1; 74/490.01; 414/917; 901/15

(58) Field of Classification Search ............. 414/749.1, 414/744.5, 917; 901/15; 74/490.01
See application file for complete search history.

(56) References Cited

U.S. PATENT DOCUMENTS 5,151,008 A * 9/1992 Ishida et al. ............. 414/744.5
6,910,847 B1 * 6/2005 Blaufus et al. .......... 414/744.5

FOREIGN PATENT DOCUMENTS

JP           10-6258         1/1998

* cited by examiner

*Primary Examiner*—Donald Underwood
(74) *Attorney, Agent, or Firm*—Hamre, Schumann, Mueller & Larson PC

(57) ABSTRACT

A linear moving mechanism includes a guide member providing a horizontal straight transport path, a moving member movable along the transport path and a drive mechanism which drives the moving member. The drive mechanism includes a first link arm pivotable around a first vertical shaft, and a second link arm having a first end and a second end. The first vertical shaft is on the transport path or on a line parallel to the transport path. The first end is connected to the first link arm for pivotal movement of the second link arm in a horizontal plane, whereas the second end is connected to the moving member for pivotal movement of the second link arm in a horizontal plane.

20 Claims, 34 Drawing Sheets

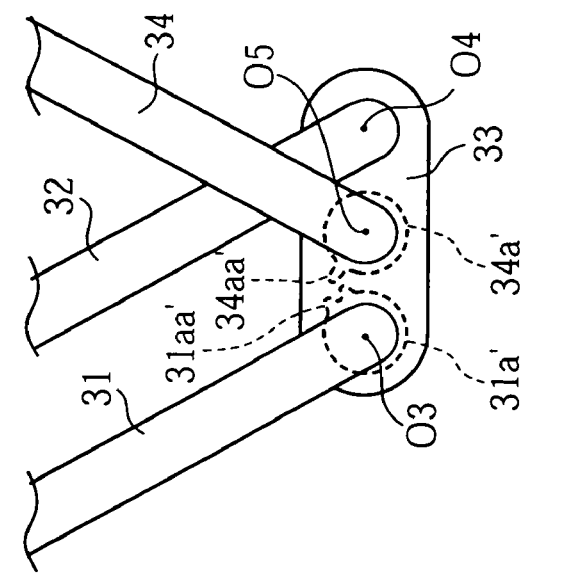
FIG.35A Forwarded Position
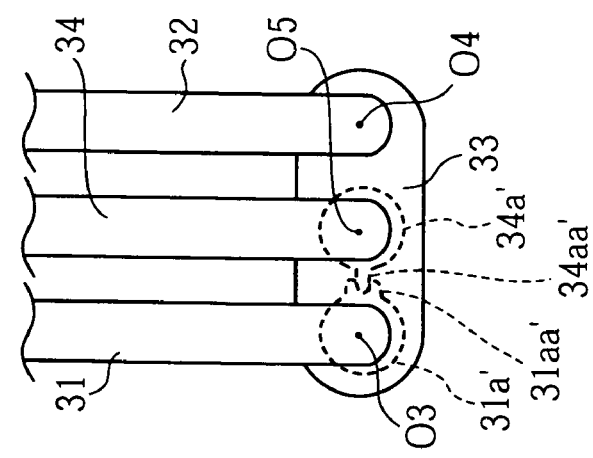
FIG.35B Near Change Point
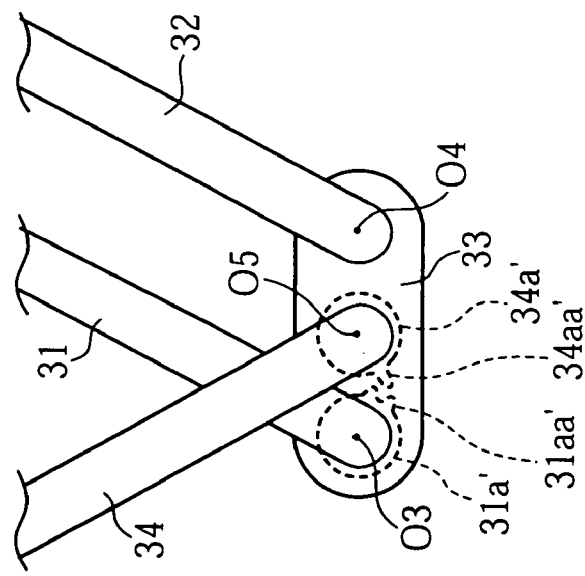
FIG.35C Retracted Position

LINEAR MOVING MECHANISM AND TRANSFER ROBOT USING THE SAME

BACKGROUND OF THE INVENTION

1. Field of the Invention

The present invention relates to a transfer robot. In particular, the present invention relates to a transfer robot for transporting a thin platy work along a straight path.

2. Description of Related Art

Transfer robots are used, for example, in manufacturing processes of semiconductor devices and liquid crystal display devices, for automated transportation of thin, plate-like works (wafers, glass substrates and so on) into and out of predetermined process chambers. Very often, such transfer robots have a mechanism of moving the work along a straight path (linear moving mechanism). Generally, such a linear transfer robot is simpler in construction than so called multi-joint robots, and therefore cheaper. Japanese Patent Laid-Open No. 10-6258 discloses an example of the linear moving mechanism used in the transfer robot.

As shown in FIG. 36 of the present application, the linear moving mechanism includes two parallelogram links for example, which work in combination. Specifically, on a base plate 91, a first main link arm 92 is pivotably supported around a shaft O1, and a first assisting link arm 93 is pivotably supported around a shaft O2. The first main link arm 92 and the first assisting link arm 93 have tips connected to a middle plate 96. The first main link arm 92 is pivotable around a shaft O3. The first assisting link arm 93 is pivotable around a shaft O4. The base plate 91, the first main link arm 92 the first assisting link arm 93 and the middle plate 96 constitute a first parallelogram link. Likewise, a second parallelogram link is constituted by the middle plate 96, a second main link arm 94, a second assisting link arm 95 and a work supporting base 97. Specifically, the second main link arm 94 is connected to pivot around the shaft O3, and the second assisting link arm 95 is connected to pivot around a shaft O5, to the middle plate 96. Likewise, the second main link arm 94 is connected to pivot around a shaft O6, and the second assisting link arm 95 is connected to pivot around a shaft O7, to the work supporting base 97. The second main link arm 94 has a length equal to that of the first main link arm 92. The work supporting base 97 is provided with a plurality of prongs for carrying a thin, plate-like work.

Pivotal movement of the first main link arm 92 around the shaft O1 and pivotal movement of the second main link arm 94 around the shaft O3 are interlinked by an unillustrated transmission mechanism. Specifically, as the first main link arm 92 pivots in a predetermined direction (e.g. clockwise direction) around the shaft O1, the second main link arm 94 pivots in the opposite direction (counterclockwise) around the shaft O3. Further, the second main link arm 94 pivots at an angular speed twice an angular speed of the first main link arm 92. Further, as described above, the first main link arm 92 and the second main link arm 94 have the same length. With such a construction, even if the two parallelogram links are deformed (while the work is being transported) the work supporting base 97 maintains a constant orientation and therefore so does the prongs 98.

Recently, for example, the wafers used in manufacture of semiconductors are larger in outside diameter than before. Similarly, in manufacture of liquid crystal displays, there is an increase in panel sizes. These require a longer distance for the works to be transported, which poses a problematic situation. Namely, in the linear moving mechanism as shown in FIG. 36, weight of the work and of the prongs which carry the work causes a tendency that the entire link arm bends in the vertical direction. (The tendency becomes apparent especially when the link arm is extended.) As a result, it becomes difficult to perform the liner transportation of the work appropriately.

In order to solve this problem without changing the basic structure of the transfer robot, it is unavoidable that more rigid materials be used in many parts of the transfer robot and/or more high-precision parts be used e.g. in the bearing. However, these will lead to a significant cost increase.

The construction in FIG. 36 also has the following problem: Specifically, if a heated work W is placed on the prongs 98, radiant heat from the work W causes thermal expansion in the second main link arm 94 and the first main link arm 92. Since the second main link arm 94 is closer to the work W than is the first main link arm 92, thermal expansion in the second main link arm 94 is greater than in the first main link arm 92. As a result, the second main link arm 94 and the first main link arm 92 become unequal to each other in the length, causing a problem that the work W cannot be moved smoothly along the straight moving path. There is another problem: Specifically the length of the moving path is dependent on the length of the first main link arm 92 and the length of the second main link arm 94. However, according to the construction in FIG. 36 (where the length of the first main link arm 92 and the length of the second main link arm 94 are the same), both of the first main link arm 92 and the second main link arm 94 must be made longer if the transportation distance of the work W is to be increased.

SUMMARY OF THE INVENTION

The present invention was made under the circumstances described above, and it is therefore an object of the present invention to provide a linear moving mechanism capable of moving the work appropriately in a straight path. Another object of the present invention is to provide a transfer robot including such a linear moving mechanism.

A linear moving mechanism provided by a first aspect of the present invention comprises a guide member providing a horizontal straight transport path, a moving member movable along the transport path and a drive mechanism which drives the moving member. The drive mechanism includes a first link arm pivotable around a first vertical shaft, and a second link arm having a first end and a second end. The first vertical shaft is on the transport path or on a line parallel to the transport path. The first end is connected to the first link arm for pivotal movement of the second link arm in a horizontal plane, whereas the second end is connected to the moving member for pivotal movement of the second link arm in a horizontal plane.

The linear moving mechanism includes the guide member, in which a horizontal straight transport path is provided. The guide member enables to define a track for the moving member to move along. Therefore, it is possible to linearly move the moving member appropriately, with a work supported by the moving member.

Preferably, the pivotal movement of the first link arm around the first vertical shaft moves a connecting point connecting the second link arm and the moving member along a path identical with the transport path, identical with a line parallel to the transport path or identical with an arc extending generally along the transport path.

Preferably, the drive mechanism further includes: an assisting link arm pivotable around a second vertical shaft which is different from the first vertical shaft; and a middle link to which the first link arm and the assisting link arm are connected for pivotal movement around a third vertical shaft and a fourth vertical shaft respectively. The first link arm, the assisting link arm and the middle arm provide a parallelogram link mechanism. Further, the second link arm is connected pivotably to the middle link around a fifth vertical shaft provided on a line passing the third vertical shaft and the fourth vertical shaft. The second link arm is connected pivotably to the moving member around a sixth vertical shaft. Further, a center-to-center distance between the fifth vertical shaft and the sixth vertical shaft is equal to a center-to-center distance between the first vertical shaft and the third vertical shaft.

Preferably, the connection of the second link arm to the moving member allows the sixth vertical shaft to move in a direction across the transport path.

Preferably, the linear moving mechanism according to the present invention further comprises an assisting moving member supported by the moving member and movable along the transport path. With this construction, the second link arm is connected pivotably to the assisting moving member around a seventh vertical shaft provided on a line passing the fifth vertical shaft and the sixth vertical shaft. The second link arm is connected to the assisting moving member for movement of the seventh vertical shaft in a direction across the transport path. The pivotal movement of the first link arm around the first vertical shaft moves the seventh vertical shaft along an arc extending generally along the transport path.

Preferably, the linear moving mechanism according to the present invention further comprises an assisting moving member supported by the moving member and movable along the transport path. With this construction, the parallelogram link mechanism includes an assisting middle link provided on a more outward side than is the middle link, and connected pivotably to the first link arm and to the assisting link arm around an eighth vertical shaft and a ninth vertical shaft. The assisting middle link connects to a third link arm, which is pivotable around a tenth vertical shaft provided on a line passing the eighth vertical shaft and the ninth vertical shaft, and is connected pivotably to the assisting moving member around an eleventh vertical shaft. A center-to-center distance between the tenth vertical shaft and the eleventh vertical shaft is equal to the center-to-center distance between the first vertical shaft and the eighth vertical shaft.

Preferably, the drive mechanism further includes: an assisting link arm pivotable around a second vertical shaft which is different from the first vertical shaft, and a middle link to which the first link arm and the assisting link arm are connected for pivotal movement around a third vertical shaft and a fourth vertical shaft respectively. The first link arm, the assisting link arm and the middle arm provide a parallelogram link mechanism. The second link arm is connected pivotably to the middle link around a fifth vertical shaft provided on a line passing the third vertical shaft and the fourth vertical shaft. The second link arm is connected pivotably to the moving member around a sixth vertical shaft, and the second link arm is connected pivotably to the moving member around a sixth vertical shaft. The connection of the second link arm to the moving member allows the sixth vertical shaft to move in a direction across the transport path. A center-to-center distance between the fifth vertical shaft and the sixth vertical shaft is longer than the center-to-center distance between the first vertical shaft and the third vertical shaft.

Preferably, the first link arm has a first gear fixed in alignment with the third vertical shaft, and the second link arm has a second gear fixed in alignment with the fifth vertical shaft. The first gear and the second gear have an identical diameter and engage with each other.

Preferably, the first link arm has a first intermittent gear fixed in alignment with the third vertical shaft, and the second link arm has a second intermittent gear fixed in alignment with the fifth vertical shaft. The first intermittent gear and the second intermittent gear make temporary engagement with each other.

Preferably, the first link arm has a first gear and a third gear fixed in alignment with the third vertical shaft and the eighth vertical shaft respectively, and the second link arm has a second gear fixed in alignment with the fifth vertical shaft. The first gear and the second gear have an identical diameter and engaging with each other. The third link arm has a fourth gear fixed in alignment with the tenth vertical shaft. The third gear and the fourth gear have an identical diameter and engage with each other.

Preferably, the first link arm has a first intermittent gear and a third intermittent gear fixed in alignment with the third vertical shaft and the eighth vertical shaft respectively. The second link arm has a second intermittent gear fixed in alignment with the fifth vertical shaft. The first intermittent gear and the second intermittent gear make temporary engagement with each other. The third link arm has a fourth intermittent gear fixed in alignment with the tenth vertical shaft. The third intermittent gear and the fourth intermittent gear make temporary engagement with each other.

A transfer robot provided by a second aspect of the present invention comprises: a linear moving mechanism for moving a work along a horizontal straight transport path; and a fixed base supporting the linear moving mechanism. The linear moving mechanism includes: a guide member providing a horizontal straight transport path; a moving member movable along the transport path; and a drive mechanism which drives the moving member. The drive mechanism includes a first link arm pivotable around a first vertical shaft, and a second link arm having a first end and a second end. The first vertical shaft is on the transport path or on a line parallel to the transport path. The first end is connected to the first link arm for pivotal movement of the second link arm in a horizontal plane, whereas the second end is connected to the moving member for pivotal movement of the second link arm in a horizontal plane. The linear moving mechanism supported by the fixed base allows the guide member to swivel around a vertical swivel shaft on the transport path. The moving member has a prong on which the work is to be placed.

Preferably, the linear moving mechanism supported by the fixed base is capable of rising and lowering along the swivel shaft.

Preferably, the linear moving mechanism is on a swivel base rotatable around the swivel shaft with respect to the fixed base. The moving member includes a first moving member and a second moving member supported by the guide member movably along the transport path without interfering with each other. The drive mechanism includes a first drive mechanism and a second drive mechanism provided in the swivel base for driving the first moving member and the second moving member respectively.

Preferably, the first drive mechanism and the second drive mechanism are symmetric with each other with respect to the transport path.

Preferably, the guide member is provided with a pair of first guide rails and a pair of second guide rails. The first guide rails movably support the first moving member, while sandwiching the transport path. The second guide rails movably support the second moving member, while sandwiching the transport path from outside the first guide rails.

Preferably, each of the first moving member and the second moving member has a prong support supporting a plurality of prongs. The prong support of the second moving member is above the prong support of the first moving member. The second moving member is supported by the second guide rails via a pair of supporting arms extending from two sides of the prong support of the second moving member to detour two sides of the prong support of the first moving member.

Preferably, the first moving member includes a connecting arm inward of the second guide rails and extending through the guide member, and is connected to the second link arm of the first drive mechanism via the connecting arm. The second moving member is connected to the second link arm of the second drive mechanism in an appropriate region of the supporting arms.

Preferably, the transfer robot according to the present invention further comprises an assisting moving member supported by the second moving member. With is construction, each of the first moving member and the assisting moving member has a prong support supporting a plurality of prongs. The prong support of the assisting moving member is above the prong support of the first moving member whereas the second moving member is supported by the second guide rails via a pair of supporting arms extending from two sides of the prong support of the second moving member to detour two sides of the prong support of the first moving member.

Preferably, the first moving member includes a connecting arm inward of the second guide rails and extending through the guide member, and is connected to the second link arm of the first drive mechanism via the connecting arm. The second moving member is connected to the second link arm of the second drive mechanism in an appropriate region of the supporting arms. The assisting moving member is connected to the second link arm of the second drive mechanism via a longitudinal guide groove extending in a direction across the transport path.

Other characteristics and advantages of the present invention will become clearer from the following description on preferred embodiments.

BRIEF DESCRIPTION OF THE DRAWINGS

FIGS. 35A through 35C are plan views showing variations to the first through the sixth embodiments.

DETAILED DESCRIPTION OF PREFERRED EMBODIMENTS

Hereinafter, preferred embodiments of the present invention will be described specifically, with reference to the attached drawings.

Figure 1:
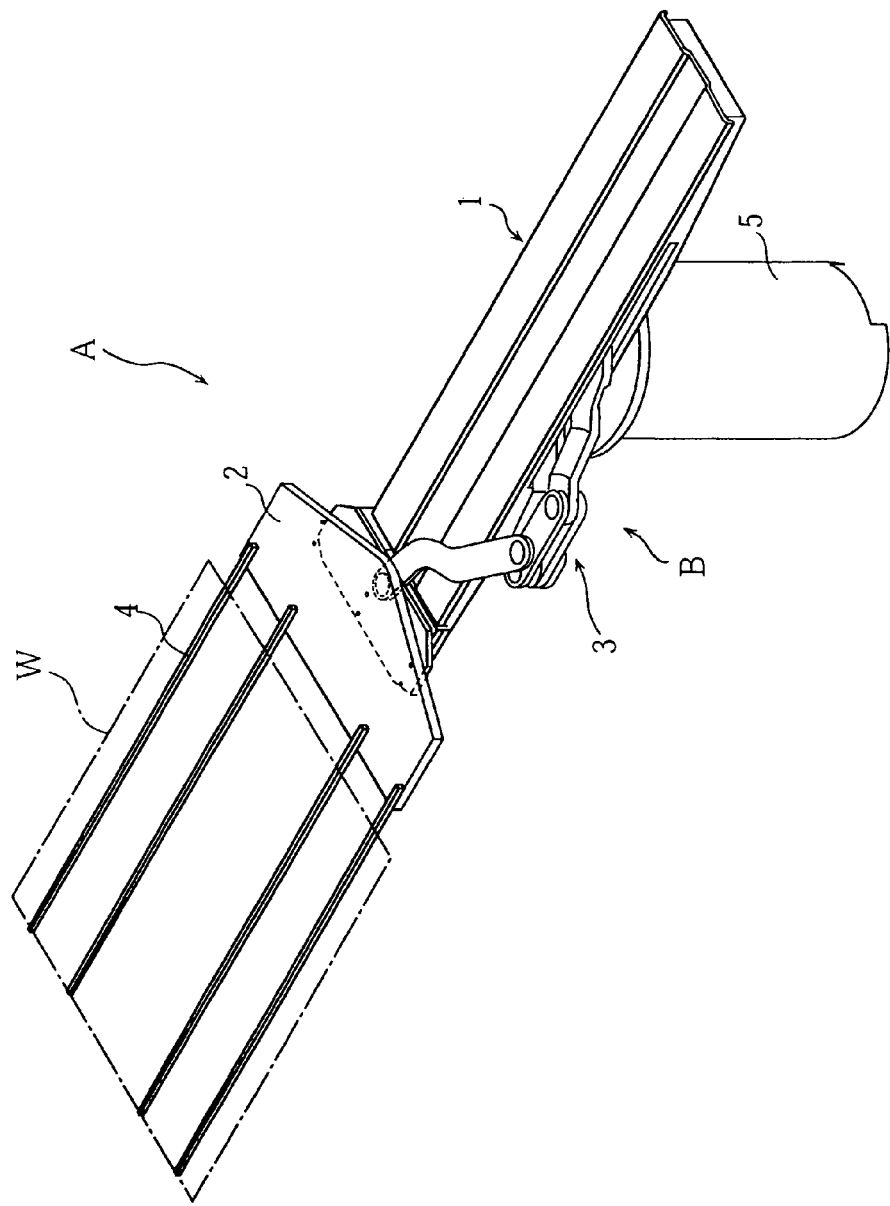
FIG. 1 is a perspective view of a transfer robot according to a first embodiment of the present invention.
Figure 2:
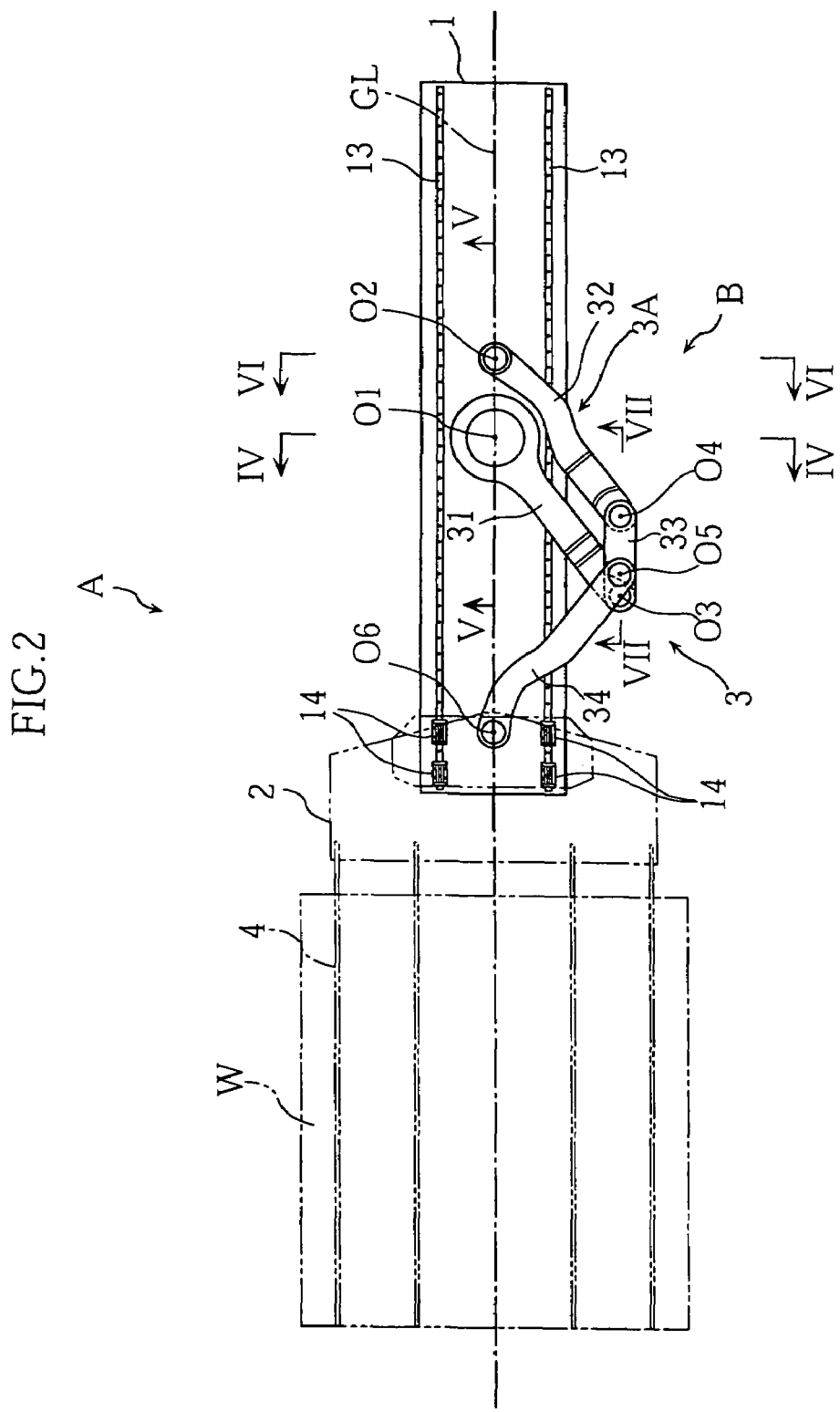
FIG. 2 is a plan view of the transfer robot.
Figure 3:
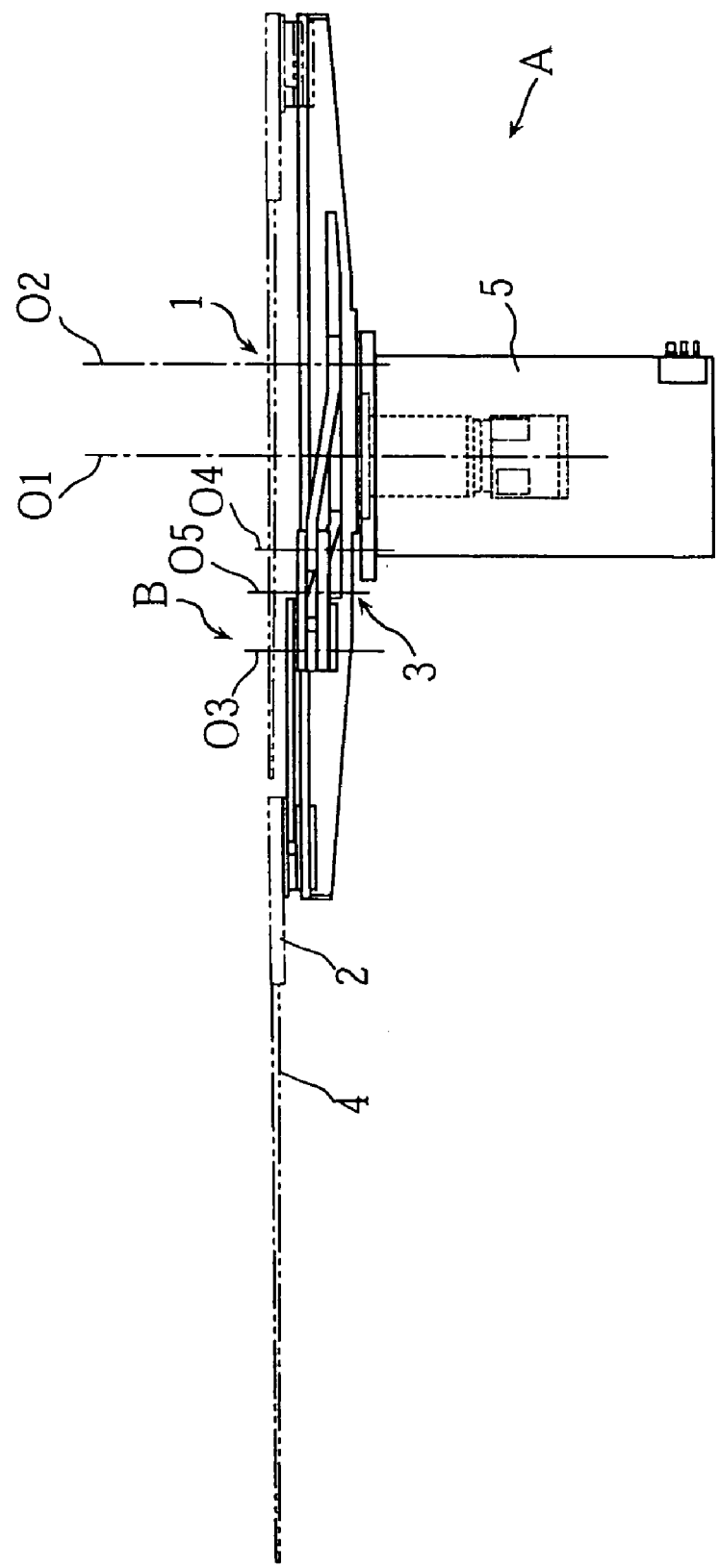
FIG. 3 is a side view of the transfer robot.

FIG. 1 through FIG. 9 show a transfer robot according to a first embodiment of the present invention. As shown in FIG. 1, FIG. 2 and FIG. 3, the transfer robot A according to the first embodiment includes a fixed base 5 and a linear moving mechanism B. The linear moving mechanism B, supported by the fixed base 5, is pivotable around a first vertical shaft O1 and can be raised and lowered. The linear moving mechanism B includes a table-like guide member 1 and a moving member 2 movable along a predetermined horizontal straight path on the guide member 1. The moving member 2 is moved in predetermined directions by a drive mechanism 3. The moving member 2 is provided with a plurality of prongs 4 capable of carrying a plate-like work W such as a glass substrate for a liquid crystal panel. (Hereinafter, an assembly made of the moving member 2 and the prongs 4 will be called "hand" when appropriate.

Figure 4:
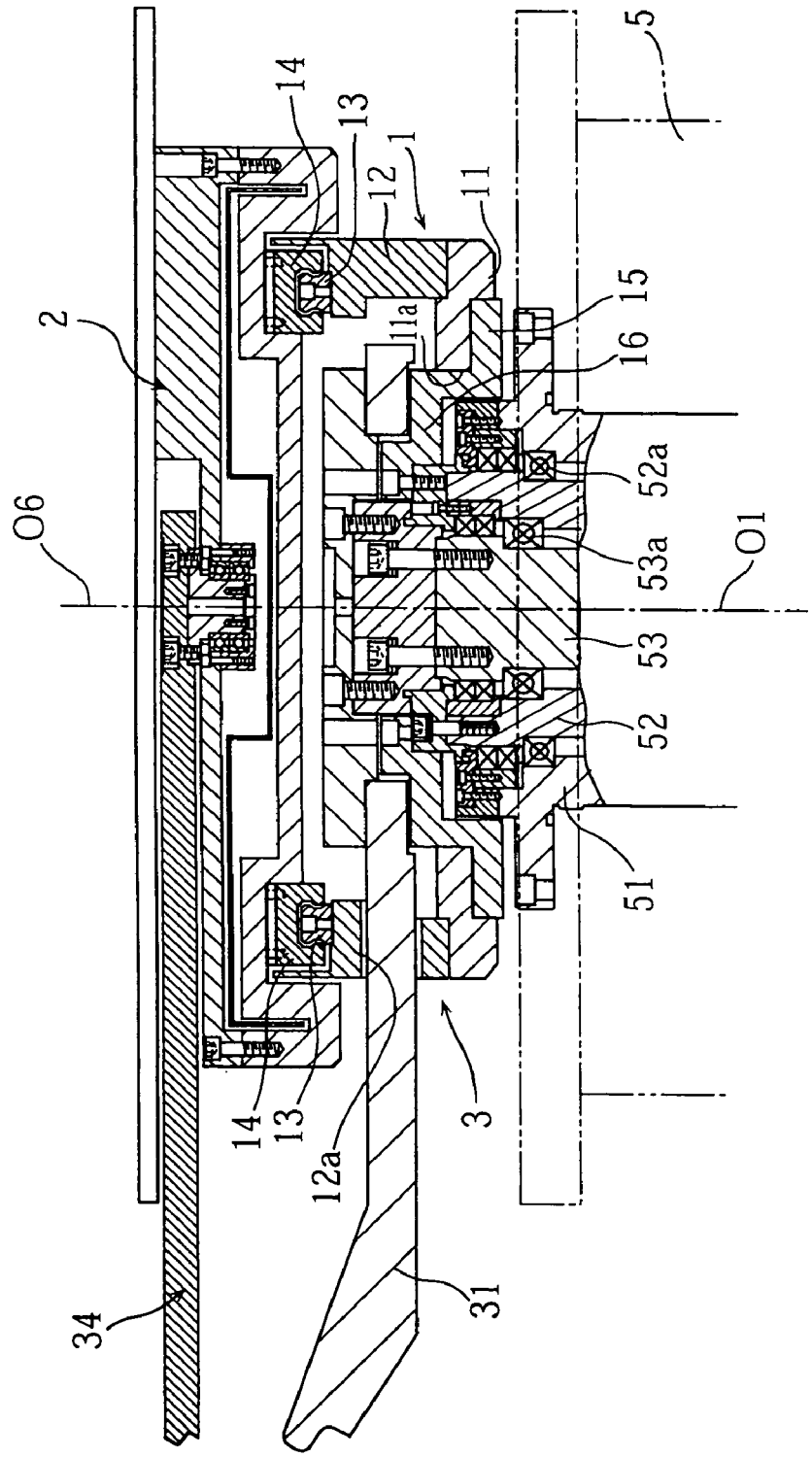
FIG. 4 is a sectional view taken in lines IV-IV in FIG. 2.
Figure 5:
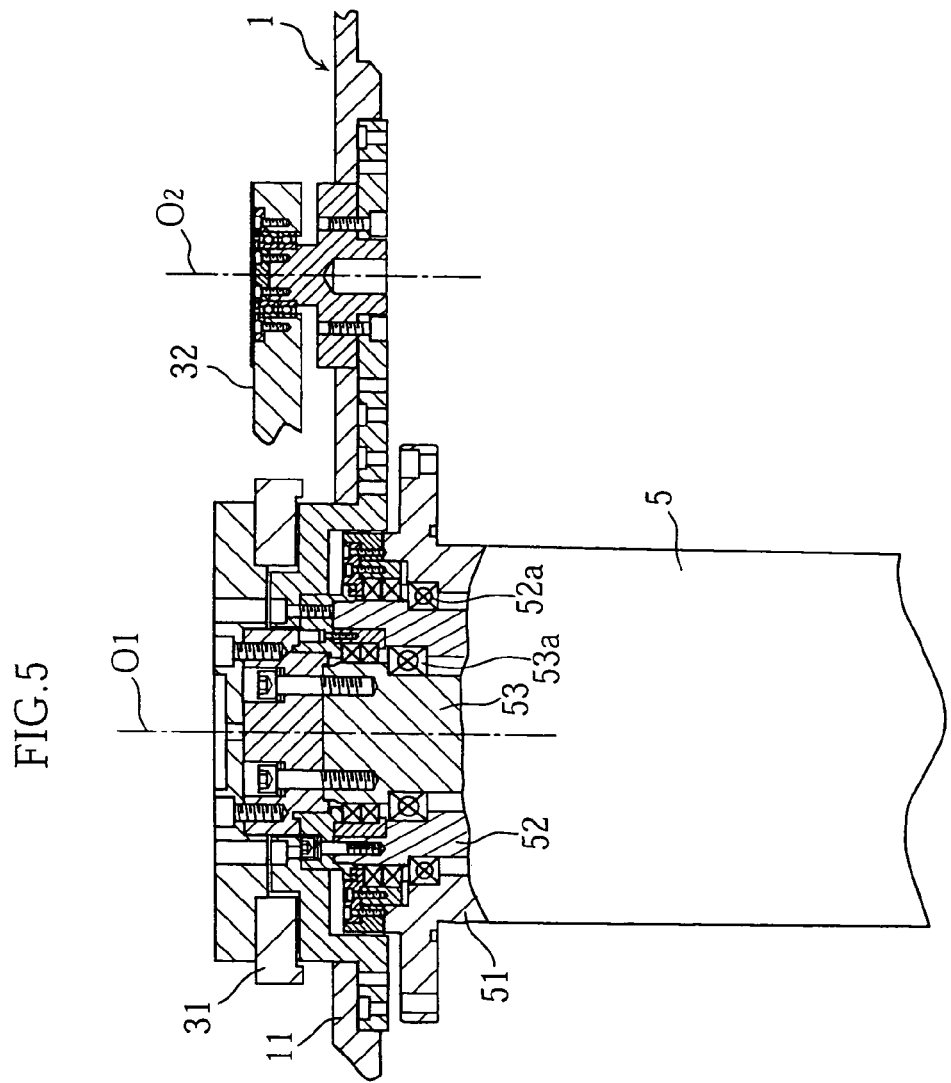
FIG. 5 is a sectional view taken in lines V-V in FIG. 2.

As shown in FIG. 4 and FIG. 5, the fixed base 5 supports, around the first vertical shaft O1, a cylindrical elevator 51 which is not rotatable but can rise and lower. The elevator 51 has a center through hole, in which there is supported a cylindrical swivel member 52 rotatably around the first vertical shaft O1 via a bearing 52a. Further, the swivel member 52 has a center through hole, in which there is supported a drive shaft 53 rotatably around the first vertical shaft O1 via a bearing 53a. The elevator 51 is raised and lowered by an unillustrated actuator. The swivel member 52 is rotated relatively to the fixed base 5 by an unillustrated rotating actuator such as a motor. The drive shaft 53 is rotated relatively with respect to the swivel member 52 by an unillustrated rotating actuator such as a motor.

As shown in FIG. 2, the guide member 1 is rectangular in plan view. Further, as shown in FIG. 4, the guide member 1 has a bottom wall 11 as well as a left and a right upright walls 12 formed on side edges. Each upright wall 12 has an upper surface provided with a guide rail 13. These guide rails 13 guide sliders 14 attached to a lower surface of the moving member 2, enabling the moving member 2 to move along a predetermined horizontal straight transport path GL on the guide member 1. In the present embodiment, the transport path GL is inline with a centerline of the guide member 1. The first vertical shaft O1 is on the transport path GL.

The guide member 1 has a longitudinal center portion, where the bottom wall 11 is formed with a through hole 11a. This through hole 11a is fitted by a bracket 15 which has a stepped, flange fitting 16. The guide member 1 is fixed, via the flange fitting 16 of the bracket 15, to an upper end of the swivel member 52. Thus, as the swivel member 52 is driven, the guide member 1 and the members mounted thereon rotates around the first vertical shaft O1. The moving member 2 is moved by a drive mechanism 3, which has the following construction:

The drive mechanism 3 includes a parallelogram link mechanism 3A provided by a first link arm 31, an assisting link arm 32 and a middle link 33. The first link arm 31 has an end fixed to an upper end of the drive shaft 53, and thus is pivoted around the first vertical shaft O1 as the drive shaft 53 drives. The assisting link arm 32 can pivot around a second vertical shaft O2 which is provided in the guide member 1 and is on the transport path GL. The middle link 33 can pivot around a third vertical shaft O3 and relatively to the first link arm 31, as well as around a fourth vertical shaft O4 and relatively to the assisting link arm 32. The distance between the first vertical shaft O1 and the third vertical shaft O3 is equal to the center-to-center distance between the second vertical shaft O2 and the fourth vertical shaft O4. Also, the distance between the first vertical shaft O1 and the second vertical shaft O2 is equal to the center-to-center distance between the third vertical shaft O3 and the fourth vertical shaft O4.

Figure 6:
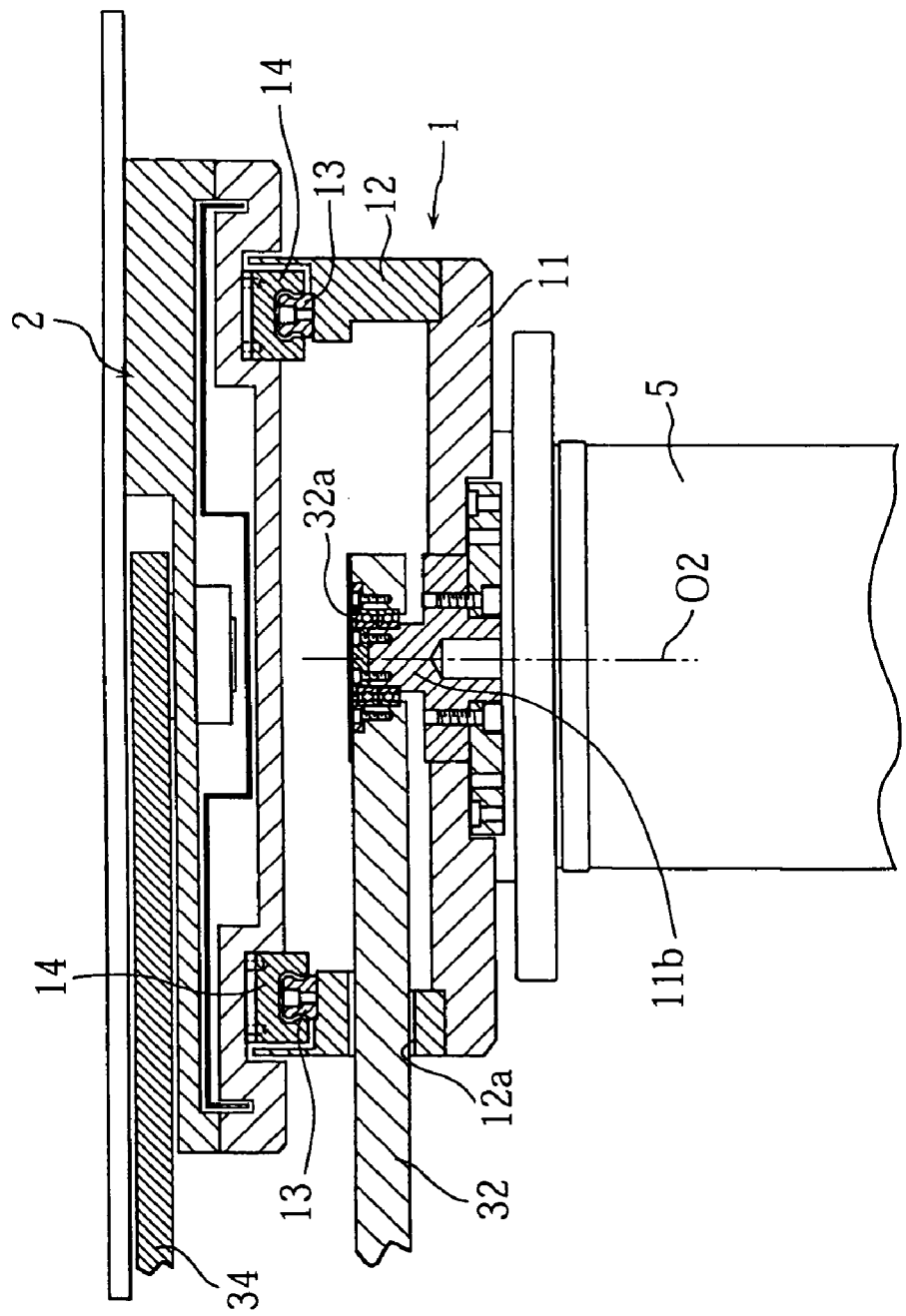
FIG. 6 is a sectional view taken in lines VI-VI in FIG. 2.

As shown in FIG. 2, the drive mechanism 3A has its middle link 33 positioned on one side of the guide member 1. As shown in FIG. 4 and FIG. 6, the first link arm 31 and the assisting link arm 32 pass through a slit 12a formed in one of the upright wall 12 of the guide member 1, extending to a side of the guide member 1. As shown in FIG. 6, the assisting link arm 32 is pivotably supported by a fixed shaft 11b attached to the bottom wall 11 of the guide member 1, via a bearing 32a.

When the first link arm 31 is pivoted, the drive mechanism 3A deforms, yet the orientation of the middle link 33 is constant, i.e. a line passing through the third vertical shaft O3 and the fourth vertical shaft O4 is always parallel to the transport path GL.

Further, the drive mechanism 3 has a second link arm 34. The second link arm 34 is pivotable around a fifth vertical shaft O5 on a line passing through the third vertical shaft O3 and the fourth vertical shaft O4, and relatively to the middle link 33. The first link arm 31 has a first gear 31a fixed thereto in alignment with the third vertical shaft O3. The second link arm 34 has a second gear 34a fixed thereto in alignment with the fifth vertical shaft O5. The first gear 31a and the second gear 34a are engaged with each other, and their diameters are equal to each other.

Figure 7:
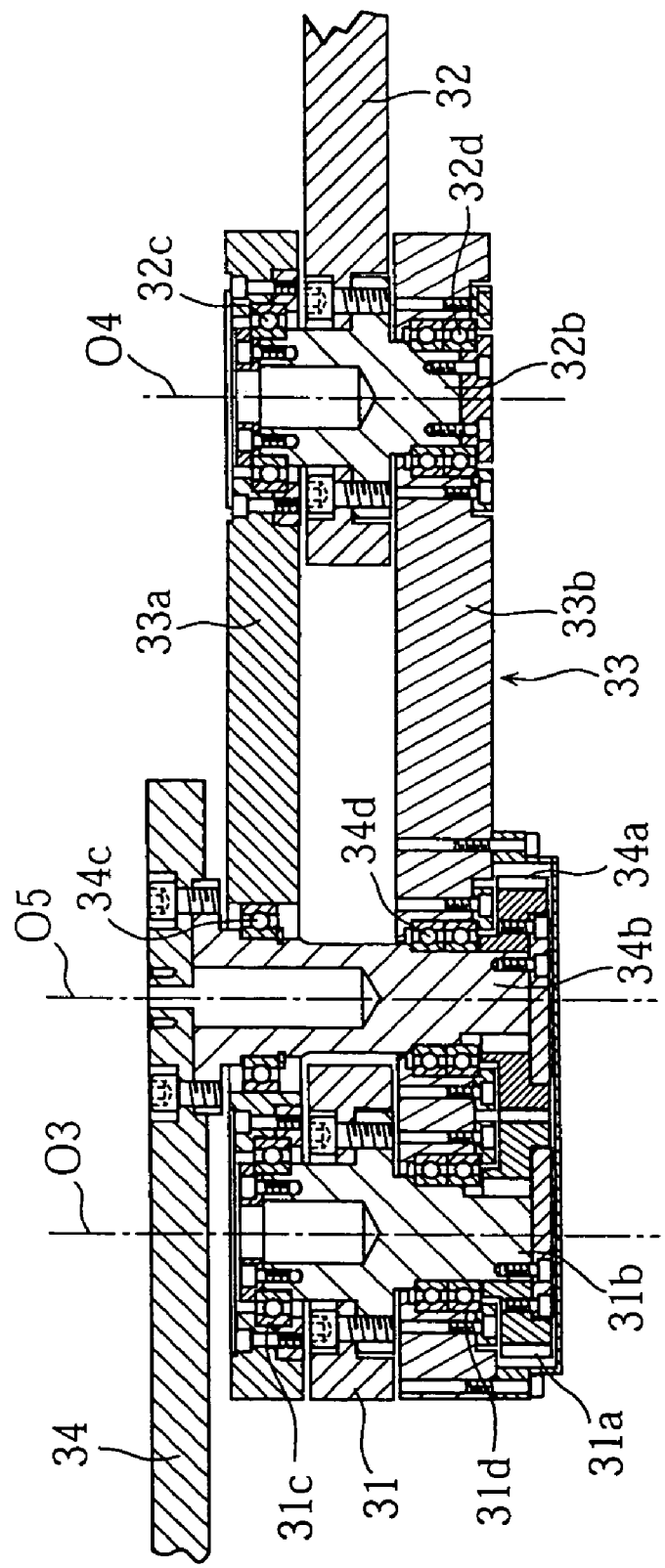
FIG. 7 is a sectional view taken in lines VII-VII in FIG. 2.

As shown in FIG. 7, the middle link 33 is provided by two link plates 33a, 33b sandwiching the first link arm 31 and the assisting link arm 32 from above and below. The first link arm 31 has a shaft member 31b fixed thereto whereas the assisting link arm 32 has a shaft member 32b fixed thereto. The shaft member 31b has an upper portion where the link plate 33a is fixed via a bearing 31c. The shaft member 31b has a lower portion where the link plate 33b is fixed via a bearing 31d. Likewise, the shaft member 32b has an upper portion where the link plate 33a is fixed via a bearing 32c, and the shaft member 32b has a lower portion where the link plate 33b is fixed via a bearing 32d. These bearings are placed in bores formed in the link plates 33a or 33b. The shaft member 31b shares its axis with the third vertical shaft O3, whereas the shaft member 32b shares its axis with the fourth vertical shaft O4.

As shown in FIG. 7, a shaft member 34b is through each of the link plates 33a, 33b of the middle link 33, and is pivotably attached to these link plates via bearings 34c, 34d respectively. The shaft 34b shares its axis with the fifth vertical shaft O5. This shaft 34b has an upper end to which a rear end of the second link arm 34 (the right end in FIG. 2) is fixed. The shaft 31b and the shaft 34b have their respective lower ends extending downward, beyond the lower link plate 33b of the middle link 33, and these protruding ends are provided with the first gear 31a or the second gear 34a described above.

A forward end of the second link arm 34 (the left end in FIG. 2) is pivotable around a sixth vertical shaft O6 and relative to the moving member 2. The sixth vertical shaft O6 is on the transport path GL. The length of the second link arm 34 (i.e. the center-to-center distance between the fifth vertical shaft O5 and the sixth vertical shaft O6) is identical with the length of the first link arm 31 (i.e. the center-to-center distance between the first vertical shaft O1 and the third vertical shaft O3).

Next, description will be made for an action of the transfer robot A which has the above construction.

Figure 8:
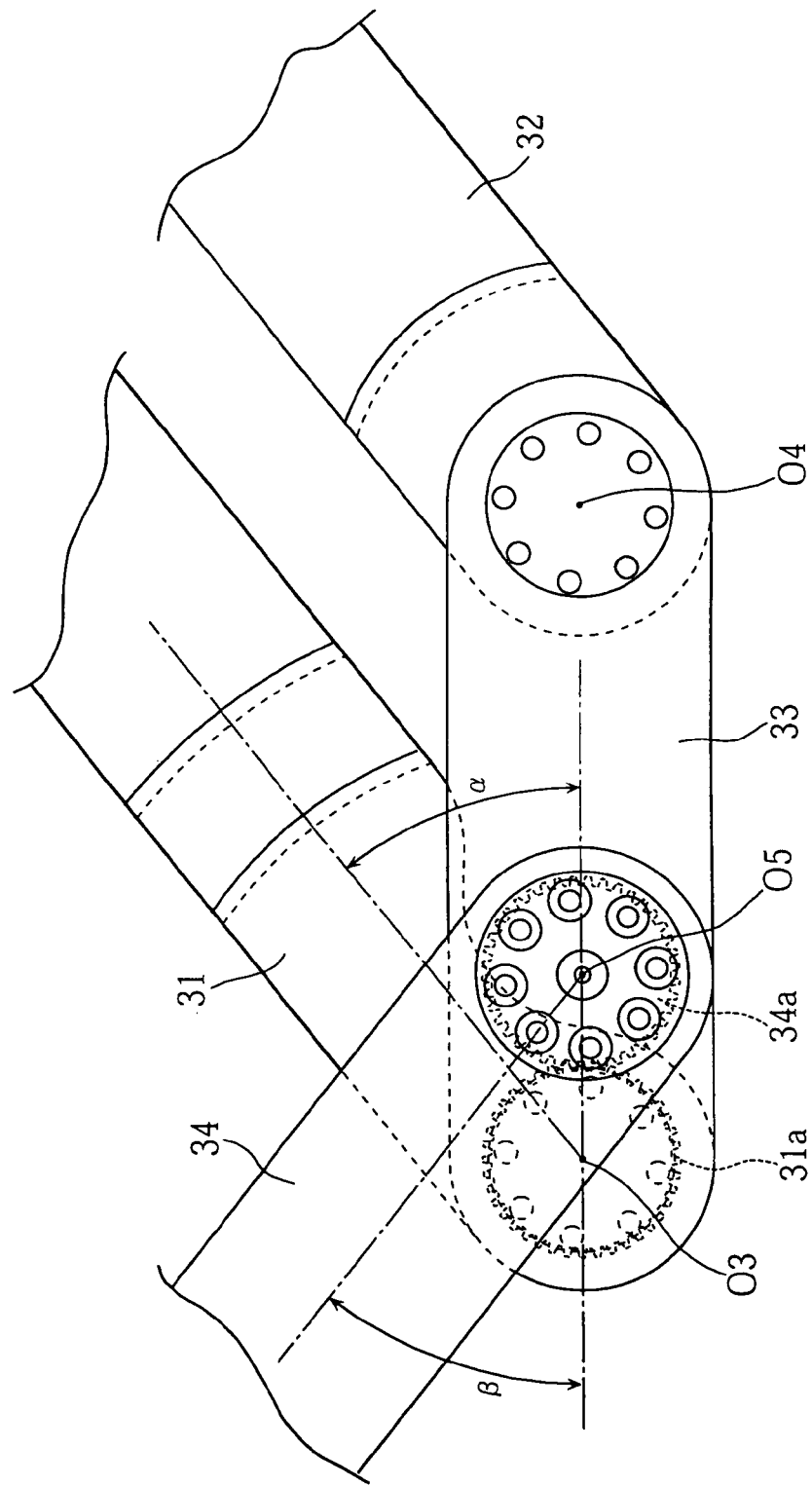
FIG. 8 is a plan view of a middle link of the transfer robot.

As described earlier, when the first link arm 31 is pivoted around the first vertical shaft O1, the drive mechanism 3A deforms but the middle link 33 is always parallel to the transport path GL. On the other hand, as shown in FIG. 8, the first gear 31a (which is fixed to the first link arm 31) and the second gear 34a (which is fixed to the second link arm 34) are engaged with each other and they are of the same diameter. Therefore, an angle α made between the first link arm 31 and the middle link 33 and an angle β made between the second link arm 34 and the middle link 33 are always equal to each other. As has been described earlier, the first link arm 31 and the second link arm 34 are equal in the length, and therefore, a line connecting the first vertical shaft O1 and the sixth vertical shaft O6 is always parallel to the middle link 33 (a line connecting the third vertical shaft O3 and the fifth vertical shaft O5). Since the middle link 33 is always parallel to the transport path GL, the line connecting the first vertical shaft O1 and the sixth vertical shaft O6 is identical with the transport path GL, which means that the drive mechanism 3 is capable, by itself, of moving the moving member 2 along the transport path GL.

Figure 9:
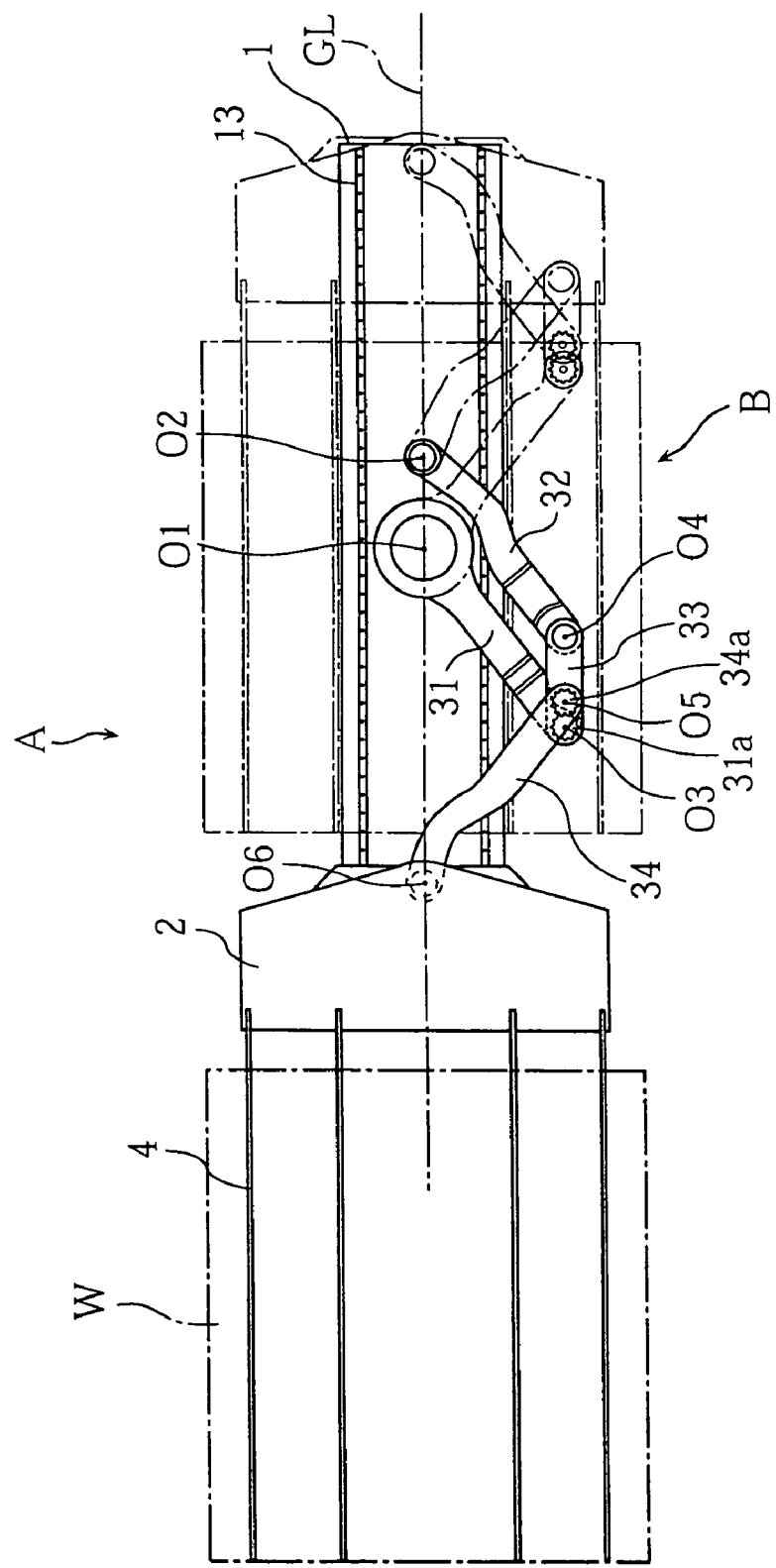
FIG. 9 is a plan view showing an action of a driving mechanism of the transfer robot.

In the present embodiment, the first vertical shaft O1 is at the longitudinal center of the guide member 1, yet the first link arm 31 and the second link arm 34 which are vertically spaced from each other do not interfere with each other. Therefore, as shown in FIG. 9, uninterrupted deformation of the drive mechanism 3A is possible from the state where the first link arm 31 is at one end of the guide member 1 with respect to the first vertical shaft O1 (as shown in solid lines), to the state where it is at the other end of the guide member 1 (as shown in long dashed short dashed lines). As a result, it is possible to move the moving member 2 all the way along the entire length of the guide member 1. Further, as has been described, the drive mechanism 3 can, by itself, move the moving member 2 along the transport path GL. Therefore, it is possible to move the moving member 2 appropriately even near a point (so called change point) where the first link arm 31 and the second link arm 34 overlap each other.

In the transfer robot A, the final straightness in the movement of the moving member 2 is achieved by the guide member 1. Also, the weight of the moving member 2 and the weight of the work placed thereon are essentially supported by the guide member 1. Therefore, the drive mechanism 3 may not be a very strong member, its construction may not be very accurate, and as a result, it is possible to manufacture this transfer robot A at a low cost.

In the transfer robot A according to the present embodiment, the elevator 51 can be raised or lowered with respect to the fixed base 5, and thereby adjust the vertical height of the linear moving mechanism B. Further, by pivoting the swivel member 52, the linear moving mechanism B can be pivoted so that the center axis of the guide member 1 orients in a desired direction.

Figure 10:
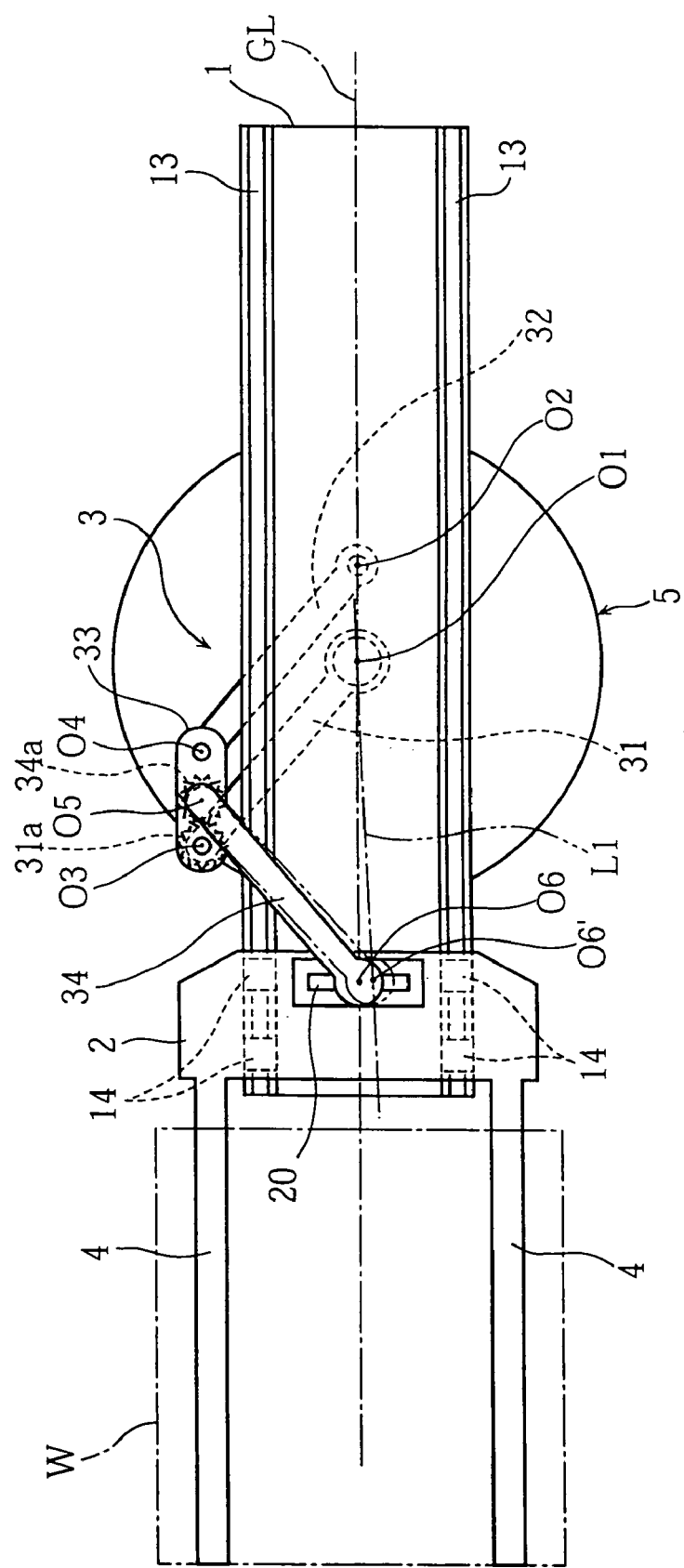
FIG. 10 is a plan view of a transfer robot according to a second embodiment of the present invention.

FIG. 10 shows a transfer robot according to a second embodiment of the present invention. It should be appreciated that for the second and later embodiments, elements identical with or similar to those already described for the first embodiment will be identified with the same alphanumerical codes and their description may not be repeated.

In this second embodiment, the moving member 2 has a longitudinal guide groove 20, in a direction across the transport path GL. The forward end of the second link arm 34 is supported and guided by the guide groove 20. Specifically, the second link arm 34 is pivotable around the sixth vertical shaft O6 relatively to the moving member 2, and the forward end (the sixth vertical shaft O6) is movable along the guide groove 20. Basically, the length of the second link arm 34 (the center-to-center distance between the fifth vertical shaft O5 and the sixth vertical shaft O6) is identical with the length of the first link arm 31 (the center-to-center distance between the first vertical shaft O1 and the third vertical shaft O3), and the sixth vertical shaft O6 is on the transport path GL (See depiction in solid lines in the figure.)

As in the first embodiment, the first link arm 31 has a first gear 31a fixed thereto in alignment with the third vertical shaft O3 whereas the second link arm 34 has a second gear 34a fixed thereto in alignment with the fifth vertical shaft O5. The first gear 31a and the second gear 34a have an identical diameter and are engaged with each other. Thus, as the first link arm 31 pivots around the first vertical shaft O1, the second link arm 34 pivots around the fifth vertical shaft O5.

In the above transfer robot, if a heated work W is placed on the prongs 4, radiant heat from the work W can thermally expand the second link arm 34. This may increase the length of the second link arm 34 (the center-to-center distance between the fifth vertical shaft O5 and the sixth vertical shaft O6) slightly, to be longer than the length of the first link arm 31 (the center-to-center distance between the first vertical shaft O1 and the third vertical shaft O3). (See depiction in long dashed double-short dashed lines in the figure.)

In such a case, when the first link arm 31 is pivoted around the first vertical shaft O1, a straight line L1 that connects the first vertical shaft O1 and the sixth vertical shaft O6' is slanted with respect to the middle link 33 (i.e. a straight line connecting the third vertical shaft O3 and the fifth vertical shaft O5). Under this state, the sixth vertical shaft O6' which is the connection point of the second link arm 34 and the moving member 2 moves along the guide groove 20. Therefore, there is no interference for the second link arm 34 to pivot around the sixth vertical shaft O6, and relatively to the moving member 2, which means that the moving member 2 moves smoothly along the transport path GL. Therefore, the transfer robot according to the second embodiment also makes possible to move the moving member 2 appropriately near the so called change point (where the first link arm 31 and the second link arm 34 overlap each other).

Figure 11:
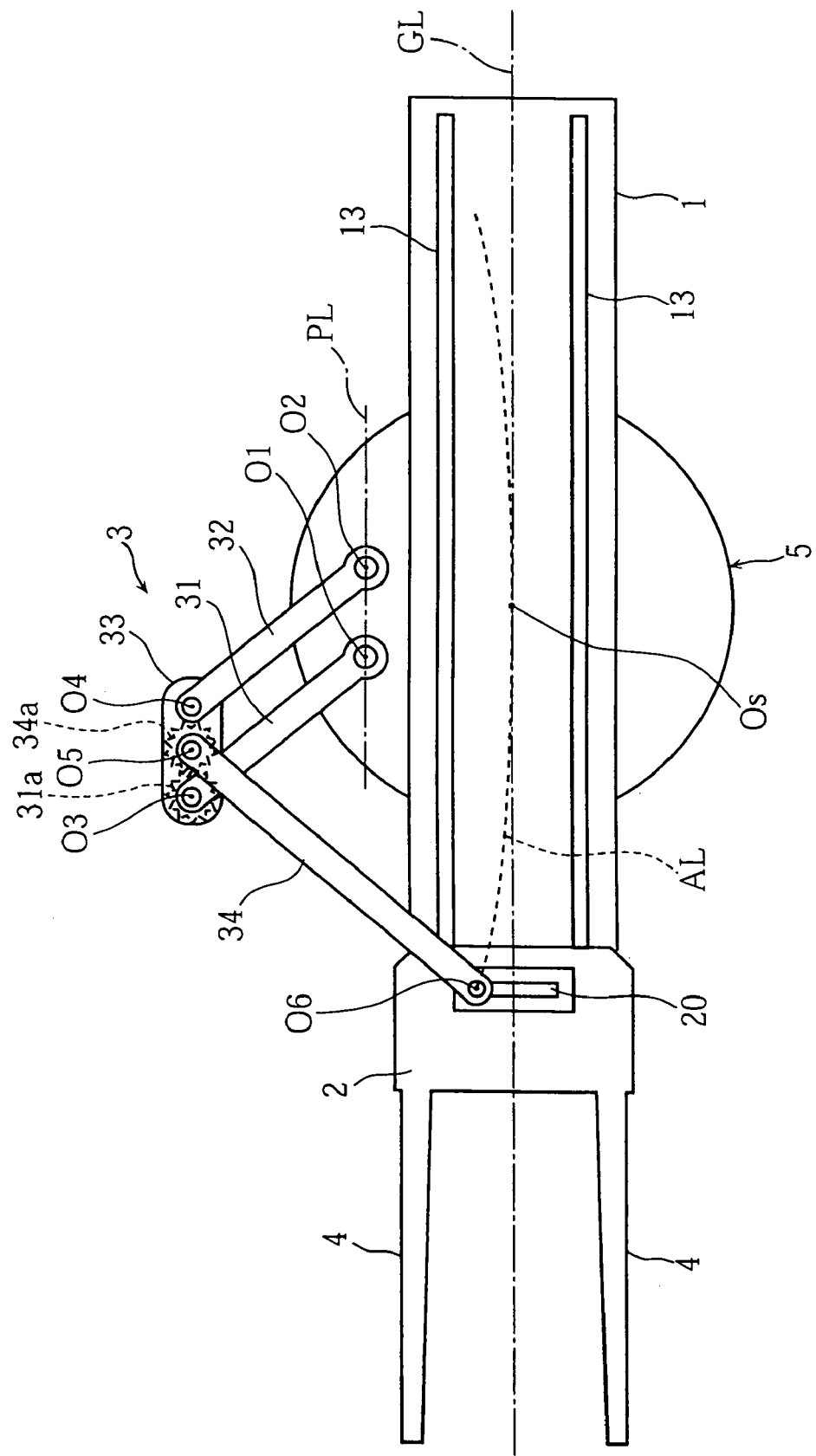
FIG. 11 is a plan view of a transfer robot according to a third embodiment of the present invention.
Figure 12:
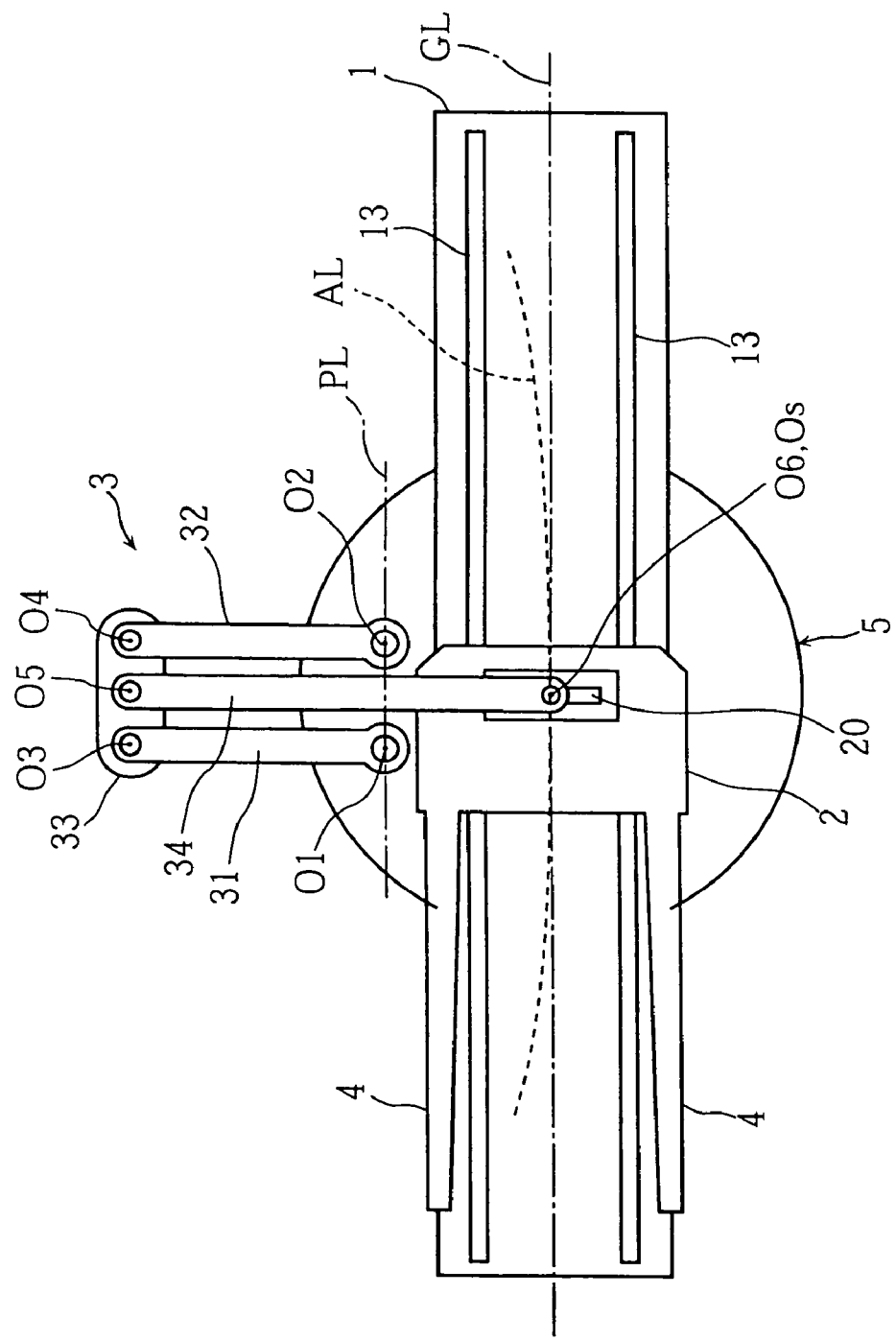
FIG. 12 is a plan view of the transfer robot in FIG. 11.

FIG. 11 and FIG. 12 show a transfer robot according to a third embodiment of the present invention.

Again, in this third embodiment, the moving member 2 has a longitudinal guide groove 20 in a direction across the transport path GL, and the forward end of the second link arm 34 is supported and guided by the guide groove 20. Specifically, the second link arm 34 is pivotable around the sixth vertical shaft O6 relatively to the moving member 2, and the forward end (the sixth vertical shaft O6) of the second link arm 34 is movable along the guide groove 20. On the other hand, the first vertical shaft O1 or the center of pivot for the first link arm 31, and O2 or the center of pivot for the assisting link arm 32 are on a line PL which is parallel to the transport path GL. The center of pivot for the guide member 1 or a swivel shaft Os is on the transport path GL. With the above, the length of the second link arm 34 (the center-to-center distance between the fifth vertical shaft O5 and the sixth vertical shaft O6) is longer than the length of the first link arm 31 (the center-to-center distance between the first vertical shaft O1 and the third vertical shaft O3). Further, as in the first and other embodiments, the first link arm 31 has a first gear 31a fixed thereto in alignment with the third vertical shaft O3 whereas the second link arm 34 has a second gear 34a fixed thereto in alignment with the fifth vertical shaft O5 (See FIG. 11). The first gear 31a and the second gear 34a again have an identical diameter and are engaged with each other. Thus, as the first link arm 31 pivots around the first vertical shaft O1, the second link arm 34 pivots around the fifth vertical shaft O5.

In the above construction, the length of the second link arm 34 (the center-to-center distance between the fifth vertical shaft O5 and the sixth vertical shaft O6) is longer than that of the first link arm 31 (the center-to-center distance between the first vertical shaft O1 and the third vertical shaft O3). Thus, when the first link arm 31 is pivoted around the first vertical shaft O1, the sixth vertical shaft O6 (the connection point of the second link arm 34 and the moving member 2) moves on a path along an arc AL shown in broken lines in FIG. 11 or FIG. 12. Under this state, the sixth vertical shaft O6 moves along the guide groove 20, and therefore, there is no interference for the second link arm 34 to pivot around the sixth vertical shaft O6 and relatively to the moving member 2, which means that the moving member 2 moves smoothly along the transport path GL. Therefore, the transfer robot according to the third embodiment also makes possible to move the moving member 2 appropriately near the so called change point. Further, since the length of the second link arm 34 can be longer than the length of the first link arm 31, it is possible to increase the distance for the moving member 2 to move along the transport path GL. (Specifically, the work can be transported in a longer distance.) Further, even if the length of the second link arm 34 may change slightly due to thermal influences, the sixth vertical shaft O6 (the connection point of the middle link 34 and the moving member 2) is still capable of moving along the guide groove 20. For this reason, there is no interference for the second link arm 34 to move relatively to the moving member 2, making it possible to move the moving member 2 smoothly along the transport path GL.

Figure 13:
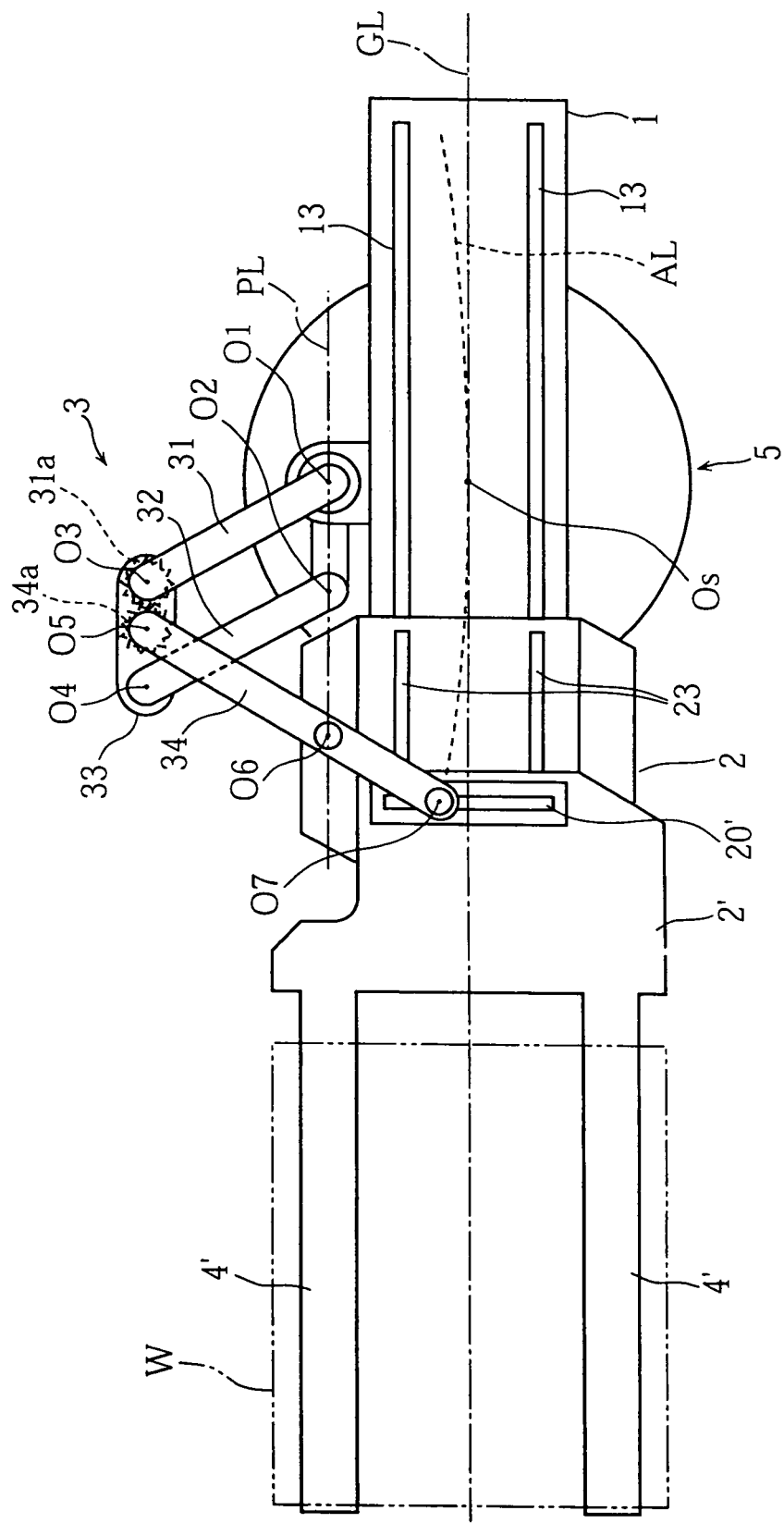
FIG. 13 is a plan view of a transfer robot according to a fourth embodiment of the present invention.
Figure 14:
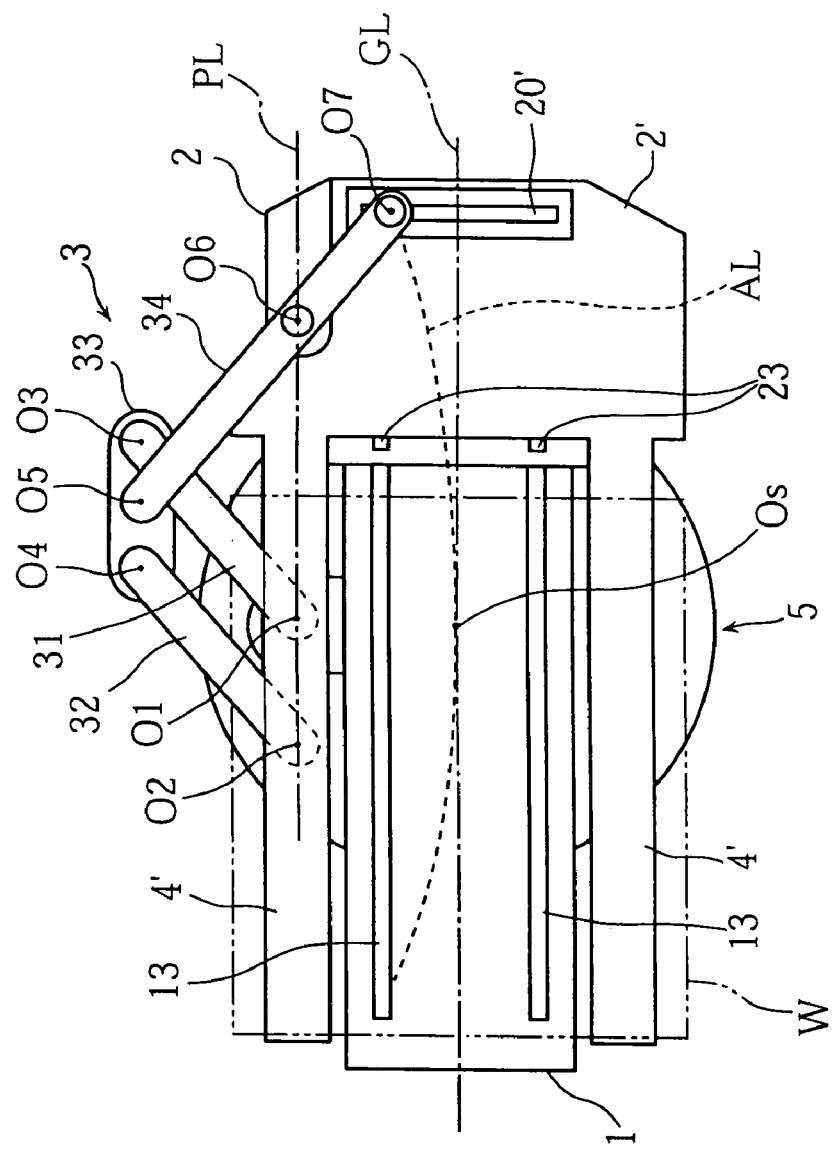
FIG. 14 is a plan view of the transfer robot in FIG. 13.

FIG. 13 and FIG. 14 show a transfer robot according to a fourth embodiment of the present invention. In the fourth embodiment, the moving member 2 supports an assisting moving member 2' movably along the transport path GL. Specifically, the moving member 2 has a horizontal face provided with a pair of guide rails 23, which allows the assisting moving member 2' to be guided along the transport path GL. These guide rails 23 support and guide a slider (not illustrated) attached to a lower surface of the assisting moving member 2'. With this arrangement, the assisting moving member 2' can move along the horizontal straight path GL provided on the guide member 1.

The assisting moving member 2' has a longitudinal guide groove 20', in a direction across the transport path GL. Further, the assisting moving member 2' is provided with prongs 4' on which a work W will be placed. On the other hand, the second link arm 34 is pivotable around the sixth vertical shaft O6 relatively to the moving member 2. In addition to these arrangements, the second link arm 34 is pivotable around a seventh vertical shaft O7 (the forward end) relatively to the assisting moving member 2'. The seventh vertical shaft O7 is on a line passing the fifth vertical shaft O5 and the sixth vertical shaft O6, and the seventh vertical shaft O7 is movable along the guide groove 20'. The center-to-center distance between the fifth vertical shaft O5 and the sixth vertical shaft O6 is equal to the center-to-center distance between the first vertical shaft O1 and the third vertical shaft O3. On the other hand, the center-to-center distance between the fifth vertical shaft O5 and the seventh vertical shaft O7 is longer than a center-to-center distance between the first vertical shaft O1 and the third vertical shaft O3.

The first vertical shaft O1, the second vertical shaft O2 and the sixth vertical shaft O6 are on a line PL which is parallel to the transport path GL. The swivel center of the guide member 1, i.e. the swivel shaft Os is on the transport path GL. Further, as in the first and other embodiments, the first link arm 31 has a first gear 31a fixed thereto in alignment with the third vertical shaft O3 whereas the second link arm 34 has a second gear 34a fixed thereto in alignment with the fifth vertical shaft O5 (See FIG. 13). The first gear 31a and the second gear 34a again have an identical diameter and are engaged with each other. Thus, as the first link arm 31 pivots around the first vertical shaft O1, the second link arm 34 pivots around the fifth vertical shaft O5. In the fourth embodiment, the first link arm 31 and the assisting link arm 32 have a revered positional relationship from the first embodiment. However, actions of these link arms are the same in the first embodiment and the fourth embodiment.

According to the above construction, the center-to-center distance between the fifth vertical shaft O5 and the seventh vertical shaft O7 is longer than the center-to-center distance between the first vertical shaft O1 and the third vertical shaft O3). Thus, when the first link arm 31 is pivoted around the first vertical shaft O1, the seventh vertical shaft O7 (the connection point of the second link arm 34 and the assisting moving member 2') moves on a path along an arc AL shown in a broken line in the figure. Under this state, the seventh vertical shaft O7 moves along the guide groove 20', and therefore, there is no interference for the second link arm 34 to pivot around the seventh vertical shaft O7 relatively to the moving member 2', whereas the center-to-center distance between the sixth vertical shaft O6 (the connection point of the second link arm 34 and the moving member 2) and the fifth vertical shaft O5 is equal to the center-to-center distance between the first vertical shaft O1 and the third vertical shaft O3. For this reason, the sixth vertical shaft O6 moves on a path along the parallel line PL in the figure. In other words, the assisting moving member 2' moves as the moving member 2 moves along the transport path GL, smoothly in the same direction in which the moving member 2 is moving. Therefore, the transfer robot according to the fourth embodiment makes possible to move the moving member 2 and the assisting moving member 2' appropriately near the change point. In addition, since the assisting moving member 2' moves with the moving member 2, it is possible to increase transportation distance of a work W.

Figure 15:
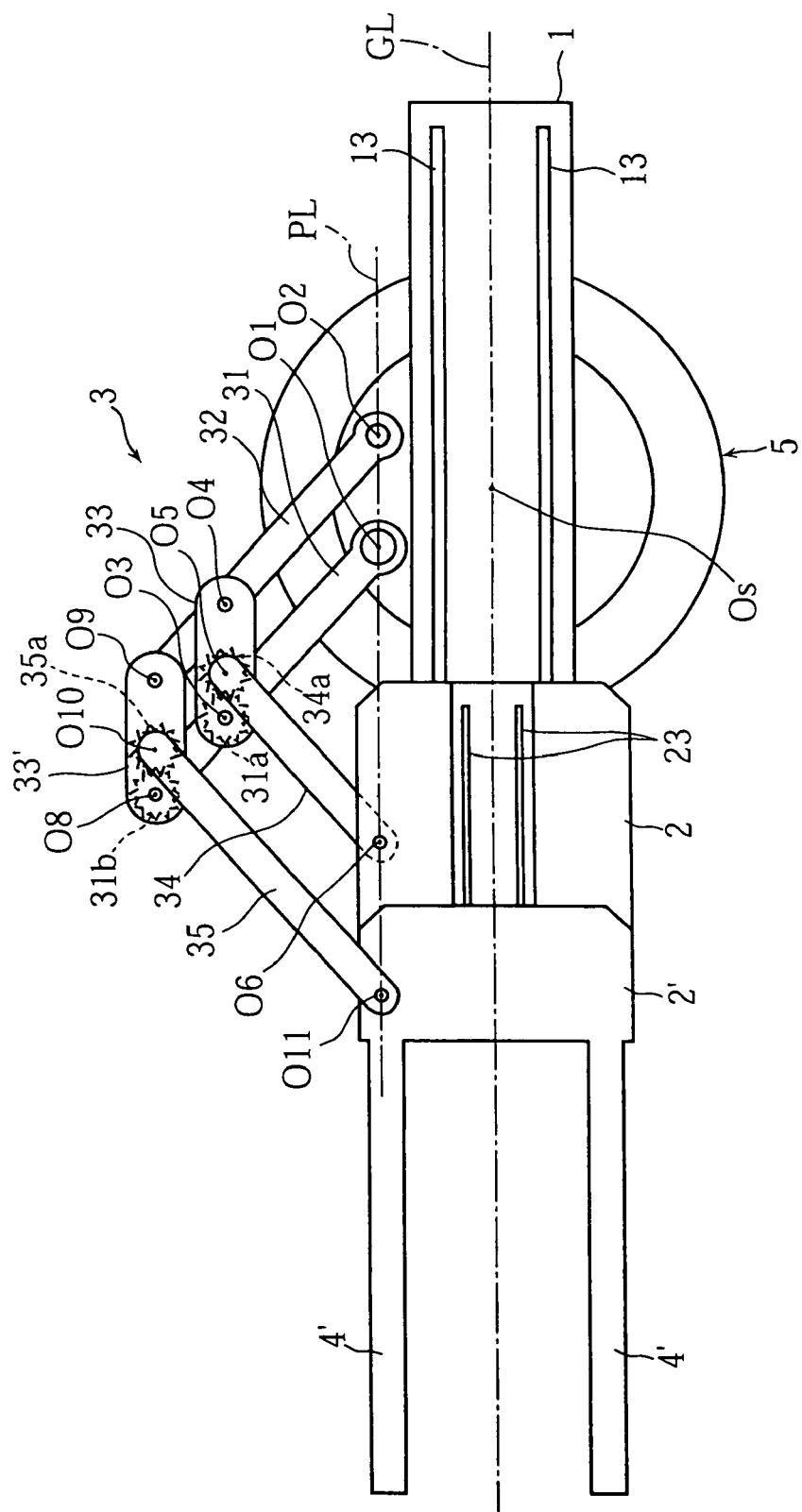
FIG. 15 is a plan view of a transfer robot according to a fifth embodiment of the present invention.
Figure 16:
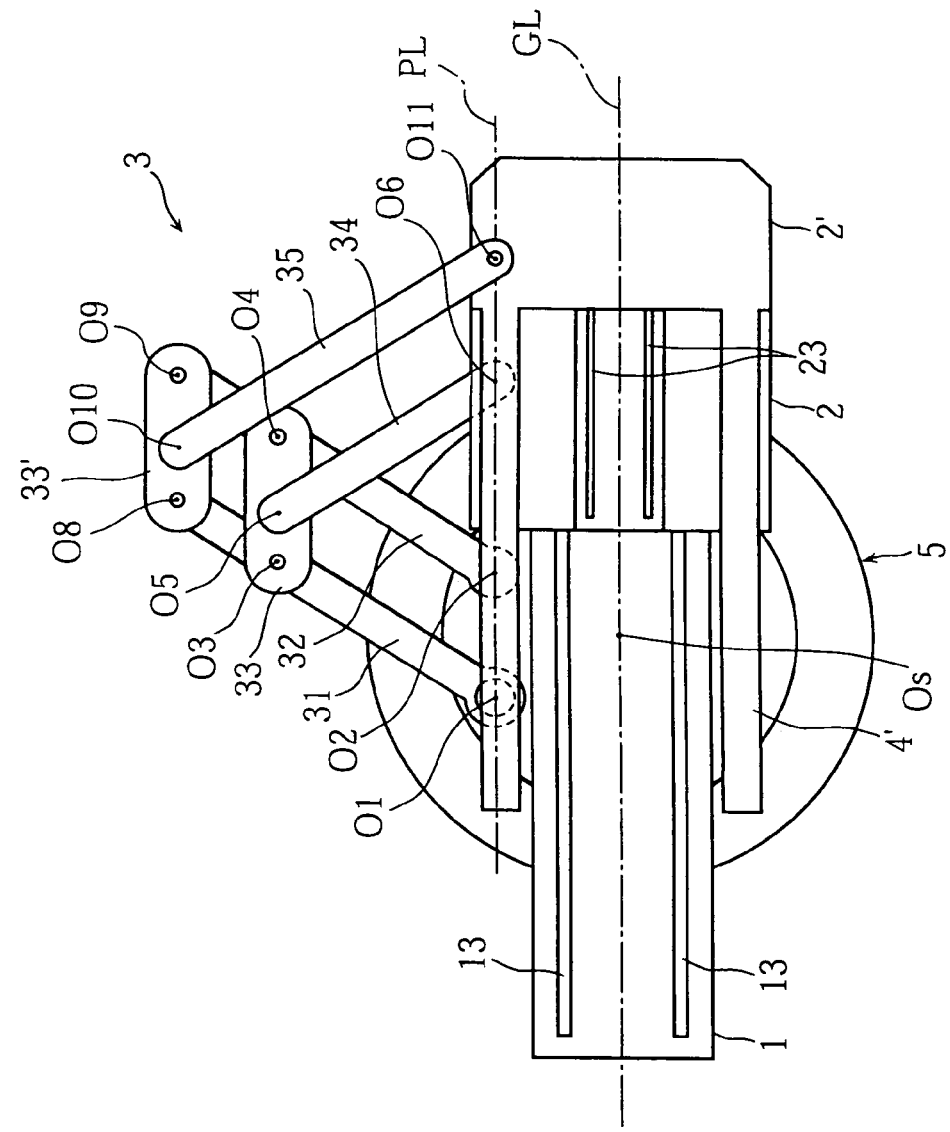
FIG. 16 is a plan view of the transfer robot in FIG. 15.

Next, FIG. 15 and FIG. 16 show a transfer robot according to a fifth embodiment of the present invention.

In the fifth embodiment, too, the moving member 2 includes an assisting moving member 2' movably supported and guided by the guide rails 23. The assisting moving member 2' can move along the transport path GL. The drive mechanism 3 includes a first link arm 31, an assisting link arm 32, a middle link 33 and a second link arm 34. The first link arm 31 and the assisting link arm 32 extend beyond the middle link 33. Further, the drive mechanism 3 includes an assisting middle link 33'. The assisting middle link 33' is pivotable around an eighth vertical shaft O8 and a ninth vertical shaft O9 relatively to the first link arm 31 and the assisting link arm 32. Further, the drive mechanism 3 includes a third link arm 35. The third link arm 35 is pivotable around a tenth vertical shaft O10 relatively to the assisting middle link 33'. The first vertical shaft O10 is on a straight line passing the eighth vertical shaft O8 and the ninth vertical shaft O9.

The second link arm 34 is pivotable around the sixth vertical shaft O6 relatively to the moving member 2. On the other hand, the third link arm 35 is pivotable around an eleventh vertical shaft Oil relatively to the moving member 2'. The center-to-center distance between the fifth vertical shaft O5 and the sixth vertical shaft O6 is equal to the center-to-center distance between the first vertical shaft O1 and the third vertical shaft O3. Further, the center-to-center distance between the tenth vertical shaft O10 and the eleventh vertical shaft O11 is equal to the center-to-center distance between the first vertical shaft O1 and the eighth vertical shaft O8. This arrangement places the first vertical shaft O1, the second vertical shaft O2, the sixth vertical shaft O6, and the eleventh vertical shaft O11 on a line PL which is parallel to the transport path GL. Further, the swivel center of the guide member 1 or the swivel shaft Os is on the transport path GL. The third link arm 35 is pivotable in a horizontal plane above a plane in which the second link arm 34 pivots.

As shown in FIG. 15, the first link arm 31 has a first gear 31a (centered in the third vertical shaft O3) and a third gear 31b (centered in the eighth vertical shaft O8). The second link arm 34 has a second gear 34a fixed thereto in alignment with the fifth vertical shaft O5. The third link arm 35 has a fourth gear 35a fixed thereto in alignment with the tenth vertical shaft O10. Of these first through the fourth gears, the first gear 31a and the second gear 34a engage with each other, and the third gear 31b and the fourth gear 35a engage with each other. These first through the fourth gears 31a, 34a, 31b, 35a all nave an identical diameter. Therefore, as the first link arm 31 pivots around the first vertical shaft O1, the second link arm 34 pivots around the fifth vertical shaft O5, whereas the third link arm 35 pivots around the tenth vertical shaft O10.

According to the above arrangement, as the first link arm 31 is pivoted around the first vertical shaft O1, the sixth vertical shaft O6 (the connection point of the second link arm 34 and the moving member 2) moves along the parallel line PL while the eleventh vertical shaft O11 (the connection point of the third link arm 35 and the assisting moving member 2') also moves along the parallel line PL. In other words, the assisting moving member 2' moves as the moving member 2 moves along the transport path GL, smoothly in the same direction in which the moving member 2 is moving. Therefore, the transfer robot according to the fifth embodiment also makes possible to move the moving member 2 and the assisting moving member 2' appropriately near the change point, and in addition, to increase transportation distance of a work W.

According to the present invention, the longitudinal guide groove extending to cross the transport path may be provided in the assisting moving member 2', for a forward end (the eleventh vertical shaft O11) of the third link arm 35 to be supported and guided thereby.

FIG. 17 through FIG. 25 show a transfer robot according to a sixth embodiment of the present invention.

As shown in FIG. 17 through FIG. 21, this transfer robot A1 includes a swivel base 300 pivotable around a vertical shaft Os and relatively to a fixed base 200.

The swivel base 300 includes a linear movement guide mechanism 400. The linear movement guide mechanism 400 supports a first moving member 20A and a second moving member 20B which are movable in the same directions. In order to drive the first moving member 20A and the second moving member 20B individually, the swivel base 300 is provided with a first drive mechanism 30A and a second drive mechanism 30B. The first moving member 20A and the second moving member 20B have prongs 21a, 21b respectively, each capable of carrying a work W.

Figure 21:
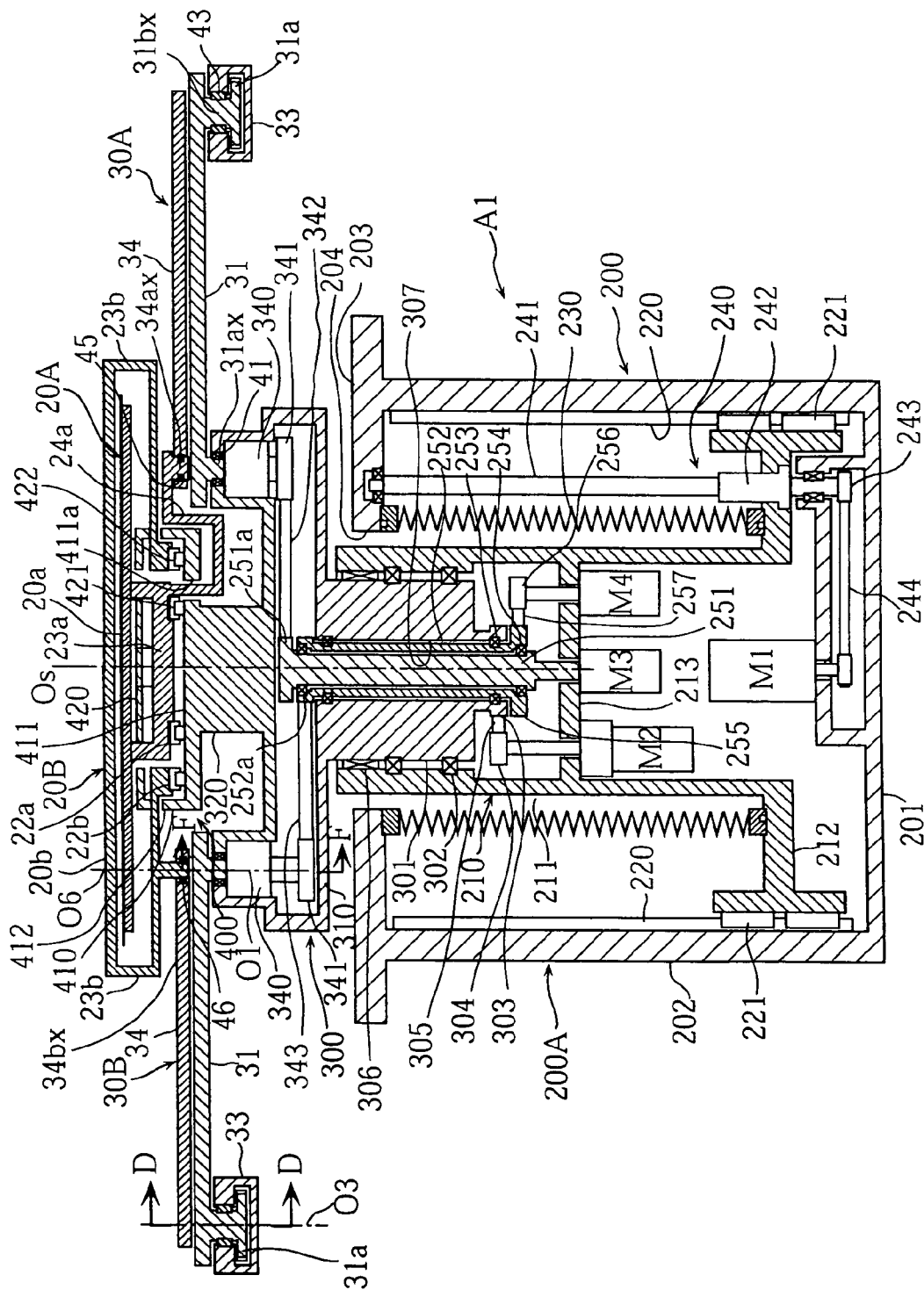
FIG. 21 is a sectional view taken in lines C-C in FIG. 19.

As shown in FIG. 21, the fixed base 200 includes a generally columnar housing 200A having a bottom wall portion 201, a cylindrical side wall portion 202 and a ceiling wall 203. The ceiling wall 203 has a center opening 204. Inside the fixed base 200, there is supported an elevator base 210 which can raise and lower. The elevator base 210 includes a cylinder 211 of a smaller outer diameter than that of the center opening 204, and an outward facing flange 212 formed at a lower end of the cylinder 211. The side wall portion 202 has an inner wall to which a plurality of straight guide rails 220 extend vertically. The outward facing flange 212 of the elevator base 210 supports a plurality of guide members 221 slidably in the vertical directions with respect to the guide rails 220, making the elevator base 210 movable in vertical directions relatively to the fixed base 200. The cylinder 211 of the elevator base 210 has an upper portion capable of moving upward beyond the center opening 204 of the housing 200A or retracting below the center opening 204. The cylinder 211 of the elevator base 210 is surrounded by a bellows 230, two ends of which are fixed to the ceiling wall 203 of the fixed base 200 and the outward facing flange 212 of the elevator base 210. The bellows 230 provides an airtight sealing between the ceiling wall 203 of the fixed base 200 and the outward facing flange 212 of the elevator base 210 regardless of the vertical movement of the elevator base 210.

The fixed base 200 is provided with a screw mechanism 240 outside the bellows 230. The screw mechanism 240 includes a vertically extending, threaded shaft 241 which is rotatable and a nut 242 engaged with the threaded shaft 241. The nut 242 is through the outward facing flange 212 of the elevator base 210 and fixed to the outward facing flange 212. The threaded shaft 241 has a lower end where a pulley 243 is attached. The pulley 243 is connected to a motor M1 via an endless belt 244. The motor M1 drives the pulley 243, and therefore the threaded shaft 241, in normal and reverse directions. As the threaded shaft 241 rotates, the elevator base 210 is raised or lowered.

The swivel base 300 is supported by the elevator base 210 pivotably around a vertical swivel shaft Os. As shown in FIG. 21, the swivel base 300 has a lower portion formed with a column 301. The column 301 is rotatably supported on an inner wall of the cylinder 211 of the elevator base 210 via a bearing 302. The column 301 of the swivel base 300 has a lower end integrally formed with a pulley 303. The pulley 303 is connected, via an endless belt 305, with a pulley 304 attached to an output shaft of a motor M2 supported by a middle wall 213 of the cylinder 211. Thus, when the motor M2 is driven, the swivel base 300 is rotated around the swivel shaft Os.

Between the cylinder 211 of the elevator base 210 and the column 301 of the swivel base 300 is a sealing mechanism 306 placed more above than the bearing 302. A space lower than the sealing mechanism 306 communicates with an inside space of the fixed base 200 around the bellows 230, making this space a closed space which is sealed airtight against the outside. The column 301 of the swivel base 300 is formed with a center hole 307 which is a vertical through hole along the swivel shaft Os. The center hole 307 accommodates transmission shafts 251, 252 which transmit driving power to the first drive mechanism 30A and the second drive mechanism 30B.

The swivel base 300 is placed above the column 301. The swivel base 300 includes a wing portion 310 extending in the horizontal directions, and a column 320 at the center of an upper surface of the wing portion. As shown in FIG. 21, the wing portion 310 is hollow, and this hollow internal space incorporates a mechanism for transmitting power to the first drive mechanism 30A and the second drive mechanism 30B. (Details will be described later.) The column 320 supports the linear movement guide mechanism 400 described above.

The linear movement guide mechanism 400 includes a guide member 410, a pair of first guide rails 421 provided on the guide member 410, and a pair of second guide rails 422. The guide member 410 is rectangular, having a horizontal longitudinal axis (the transport path GL). As shown in FIG. 21, the guide member 410 has a bottom wall 411, and a right and a left upright walls 412 formed respectively on both sides of the bottom wall 411. The first guide rails 421 are placed on the bottom wall 411 of the guide member 410, spaced by a predetermined distance, sandwiching and in parallel to the transport path GL. The second guide rails 422 sandwich the first guide rails 421 and are in parallel to the transport path GL. The first guide rails 421 support the first moving member 20A via sliders 22a attached to the bottom of the first moving member, for movement along the transport path GL. The second guide rails 422 support the second moving member 20B via sliders 22b attached to the bottom of the second moving member, for movement along the transport path GL. The guide member 410 of the linear movement guide mechanism 400 has an upper surface covered by a cover member 420 which provides covering above each of the guide rails 421, 422.

Figure 17:
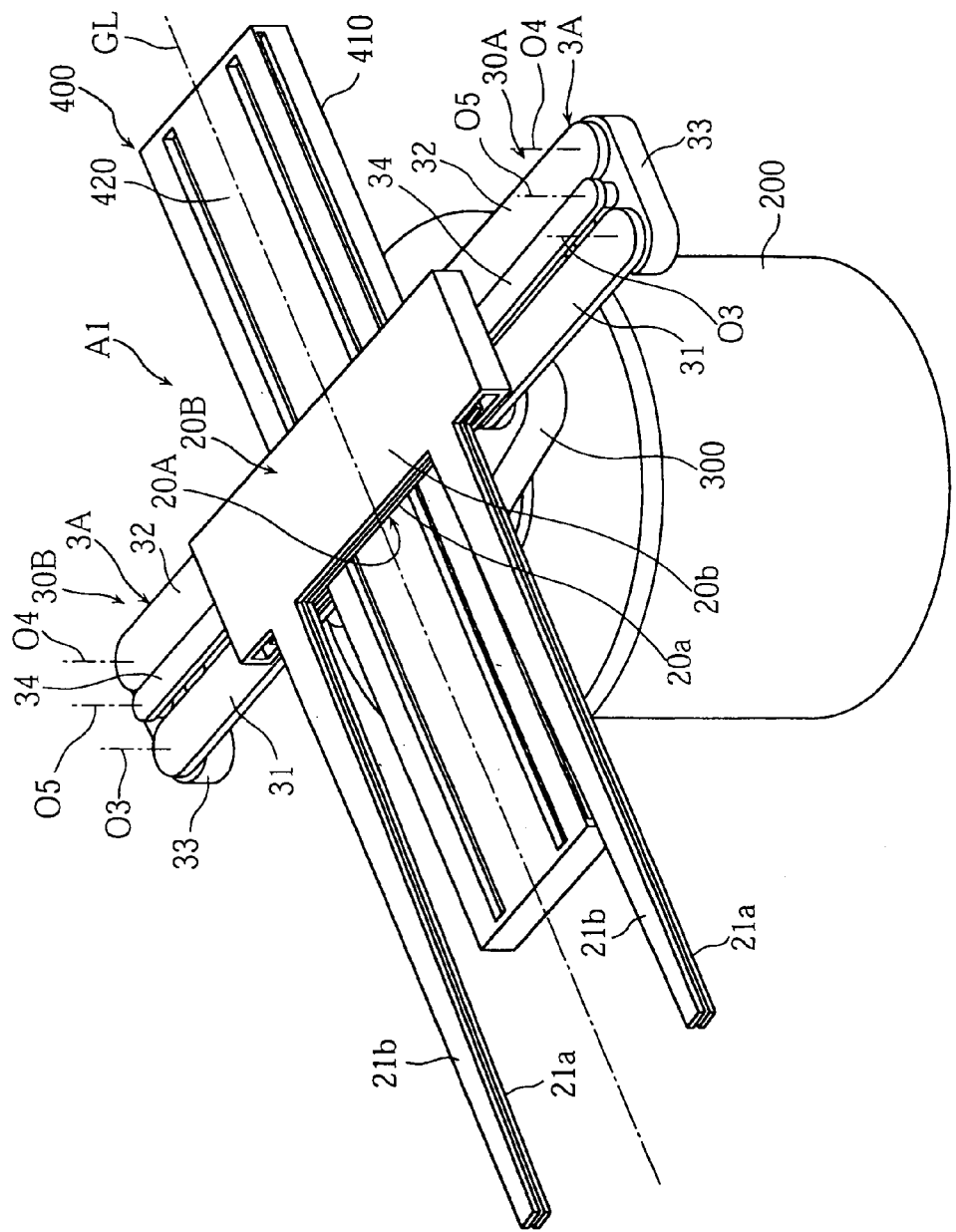
FIG. 17 is a perspective view of a transfer robot according to a sixth embodiment of the present invention.
Figure 18:
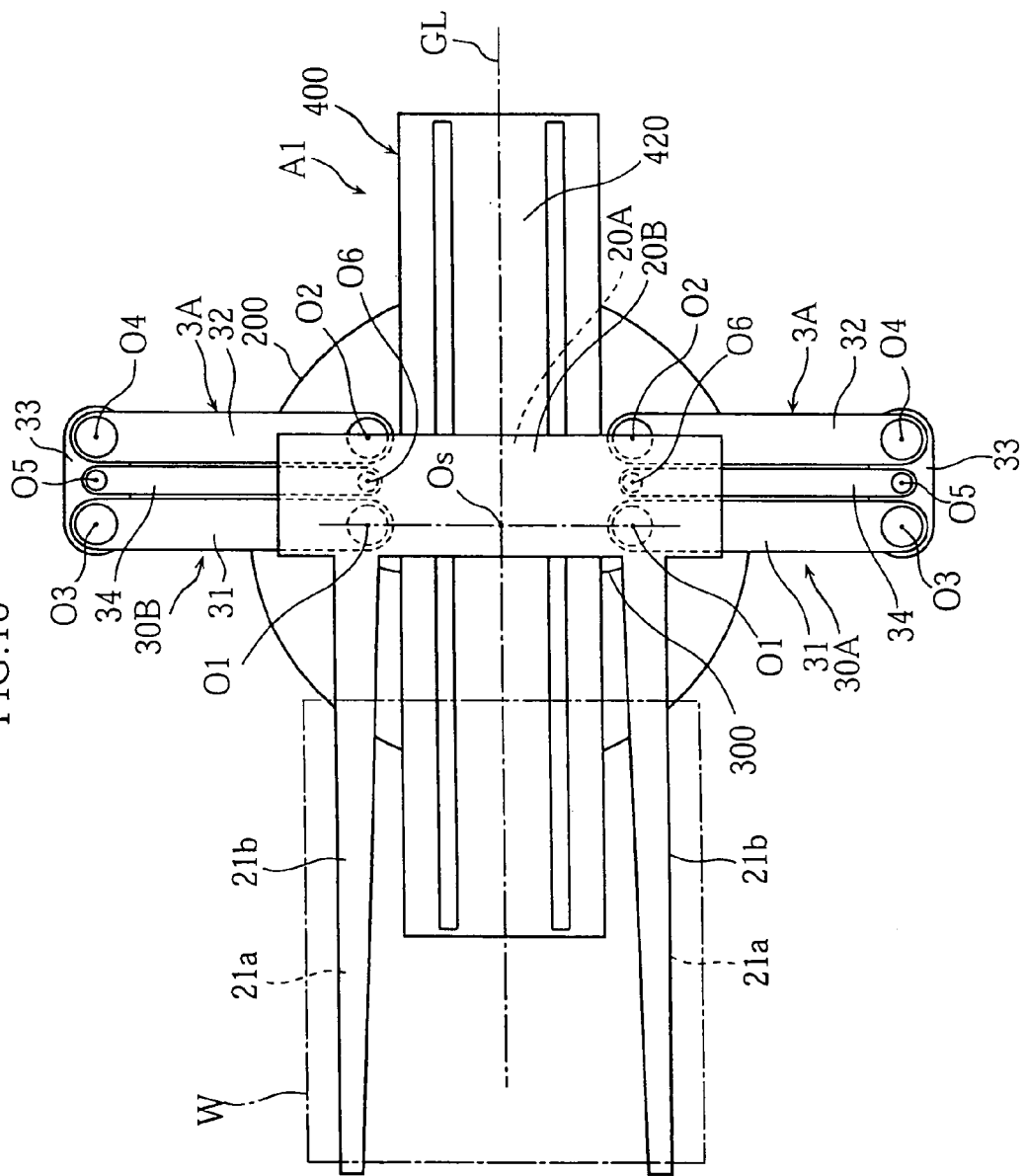
FIG. 18 is a plan view of the transfer robot in FIG. 17.

As shown in FIG. 17 and FIG. 18, the first moving member 20A and the second moving member 20B have platy horizontal prong supports 20a, 20b respectively which extend widthwise of the guide member 410 by a predetermined length. As shown in FIG. 21, these prong supports 20a, 20b are vertically spaced from each other, placed one above the other, and is capable of moving along the transport path GL without interfering with each other.

The prong support 20a of the first moving member 20A has a lower portion formed with a projected portion 23a, and is supported directly on the first guide rails 421 via the right and left pair of sliders 22a provided on this projected wall 23a. The first moving member 20A supported in this way by the first guide rails 421 is supported stably. On the other hand, as shown in FIG. 21, the prong support 20b of the second moving member 20B has a pair of supporting arms 23b extending from two widthwise end to detour the sides of the prong support 20a of the first moving member 20A, and is supported via the sliders 22b provided on this supporting arms 23b, on the second guide rails 422. This allows the entire structure of the first moving member 20A and the second moving member 20B to move along the transport path GL without interfering with each other. As for the second moving member 20B, its prong support 20b which is supported on both sides by the second guide rails 422 provides a stable support. The first moving member 20A is linked to the first drive mechanism 30A via a connecting arm 24a which extends through a slit 411a in the bottom wall 411 of the guide member 410. The second moving member 20B is linked to the second drive mechanism 30B via one of the two supporting arms 23b.

Figure 19:
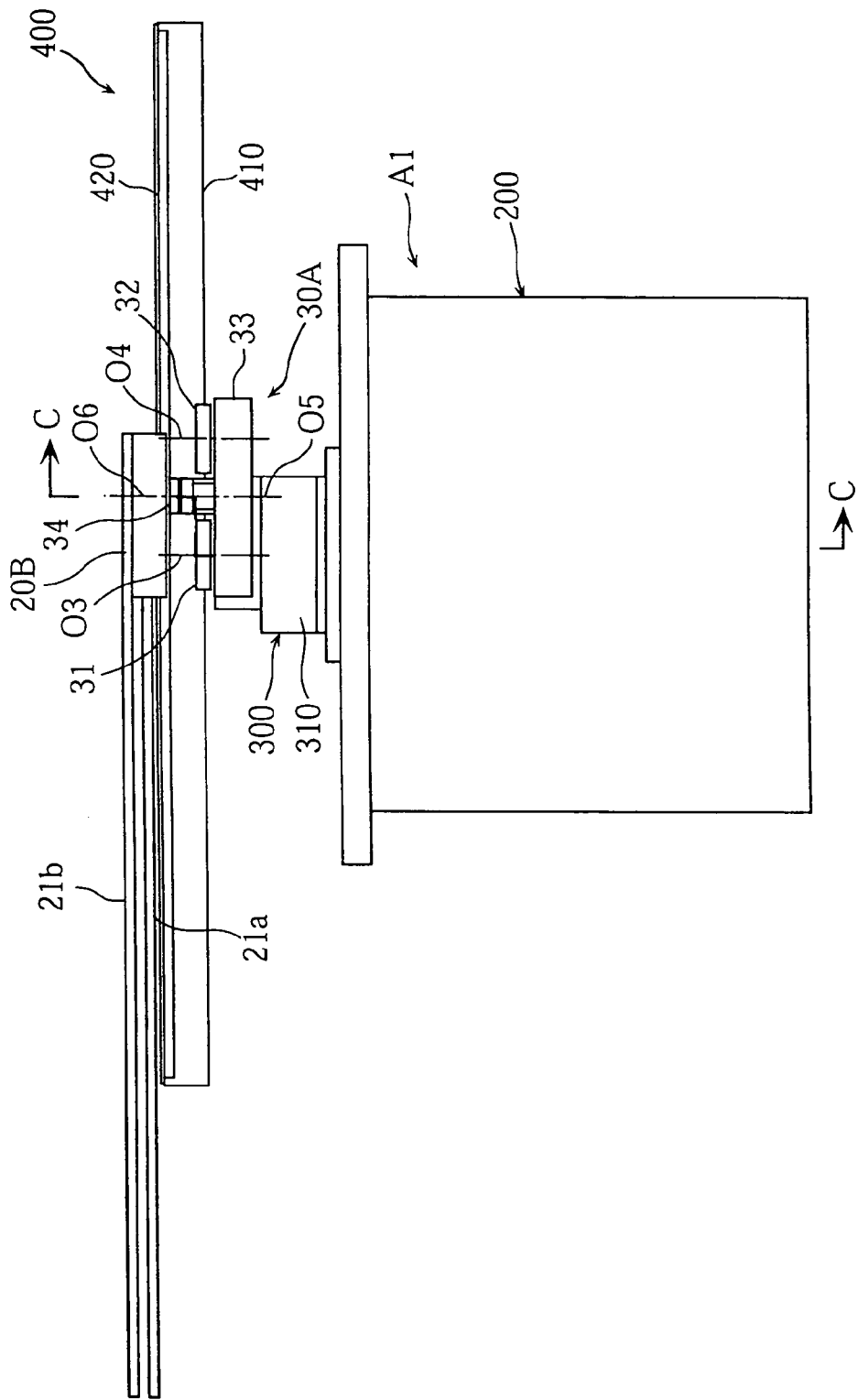
FIG. 19 is a side view of the transfer robot in FIG. 17.

As shown in FIG. 17 through FIG. 19, the prong supports 20a, 20b support, integrally therewith, the prongs 21a, 21b respectively. On each of these prongs 21a, 21b, there will be placed a relatively large work W such as a glass substrate for manufacture of a liquid crystal display panel.

The first drive mechanism 30A and the second drive mechanism 30B, which move the first moving member 20A and the second moving member 20B respectively along the transport path GL on the guide member 410 as described above, are symmetric to each other with respect to the transport path GL, and are constructed as follows according to this sixth embodiment:

Specifically, the first drive mechanism 30A and the second drive mechanism 30B each include a parallelogram pantograph link mechanism 3A made of a first link arm 31, an assisting link arm 32 and a middle link 33. The first link arm 31 is pivoted on the wing portion 310 of the swivel base 300, around a first vertical shaft O1 which is spaced laterally from the swivel shaft Os by a predetermined distance. The assisting link arm 32 is pivotable on the wing portion 310, around a second vertical shaft O2 (FIG. 18 & FIG. 23) which is on a line passing the first vertical shaft O1 and parallel to the transport path GL. The middle link 33 connects the first link arm 31 and the assisting link arm 32 for their relative pivotal movement around a third vertical shaft O3 and a fourth vertical shaft O4 respectively.

The center-to-center distance between the first vertical shaft O1 and the third vertical shaft O3 is equal to the center-to-center distance between the second vertical shaft O2 and the fourth vertical shaft O4, whereas the center-to-center distance between the first vertical shaft O1 and the second vertical shaft O2 is equal to the center-to-center distance between the third vertical shaft O3 and the fourth vertical shaft O4.

Figure 22:
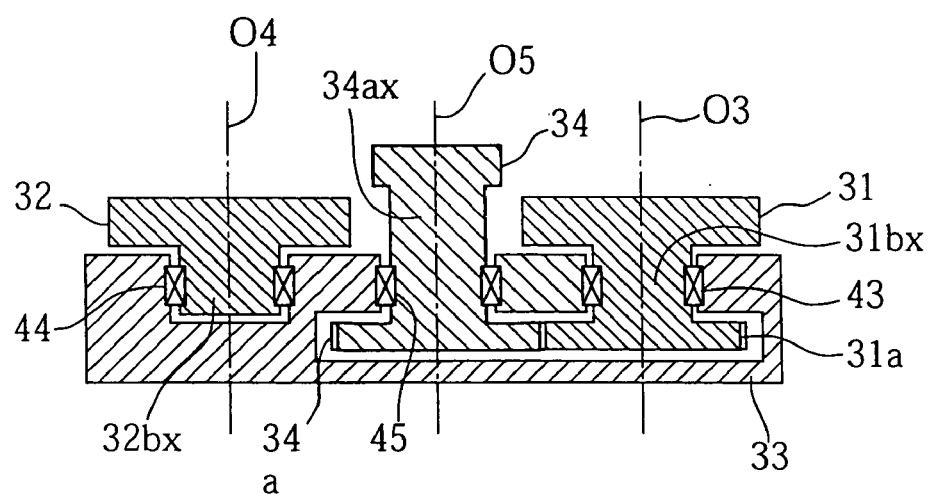
FIG. 22 is a sectional view taken in lines D-D in FIG. 21.
Figure 23:
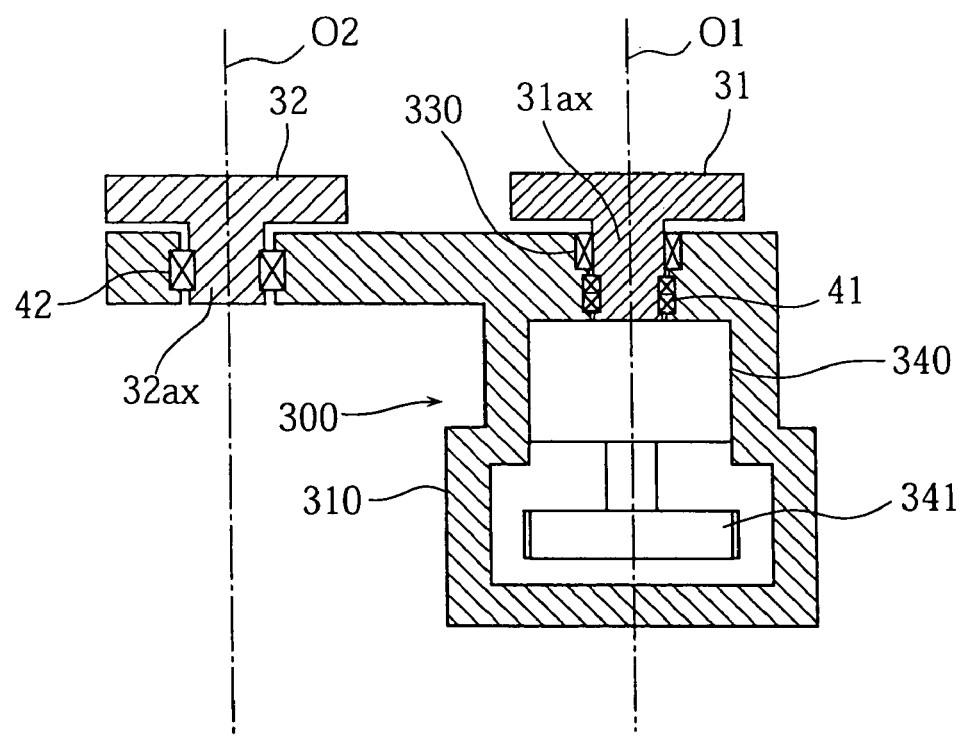
FIG. 23 is a sectional view taken in lines F-F in FIG. 21.

As shown in FIG. 21 and FIG. 23, the first link arm 31 has a base end provided with a shaft 31ax, which is rotatable with respect to the wing portion 310 via a bearing 41, making the arm 31 pivotable around the first vertical shaft O1. As shown in FIG. 23, the assisting link arm 32 likewise has a base end provided with a shaft 32ax, which is rotatable with respect to the wing portion 310 via a bearing 42, making the arm 32 pivotable around the second vertical shaft O2. As shown in FIG. 21 and FIG. 22, the first link arm 31 has a tip end provided with a shaft 31bx, which is rotatable with respect to the middle link 33 via a bearing 43, making the arm 31 pivotable around the third vertical shaft O3 and with respect to the middle link 33. Likewise, the assisting link arm 32 has a tip end provided with a shaft 32bx, which is rotatable with respect to the middle link 33 via a bearing 44, making the arm 32 pivotable around the fourth vertical shaft O4 and with respect to the middle link 33.

With the above construction, when the first link arm 31 is pivoted, the drive mechanism 3A deforms, yet the orientation of the middle link 33 is constant, i.e. a line connecting the third vertical shaft O3 and the fourth vertical shaft O4 is always parallel to the transport path GL of the guide member 410.

Figure 20:
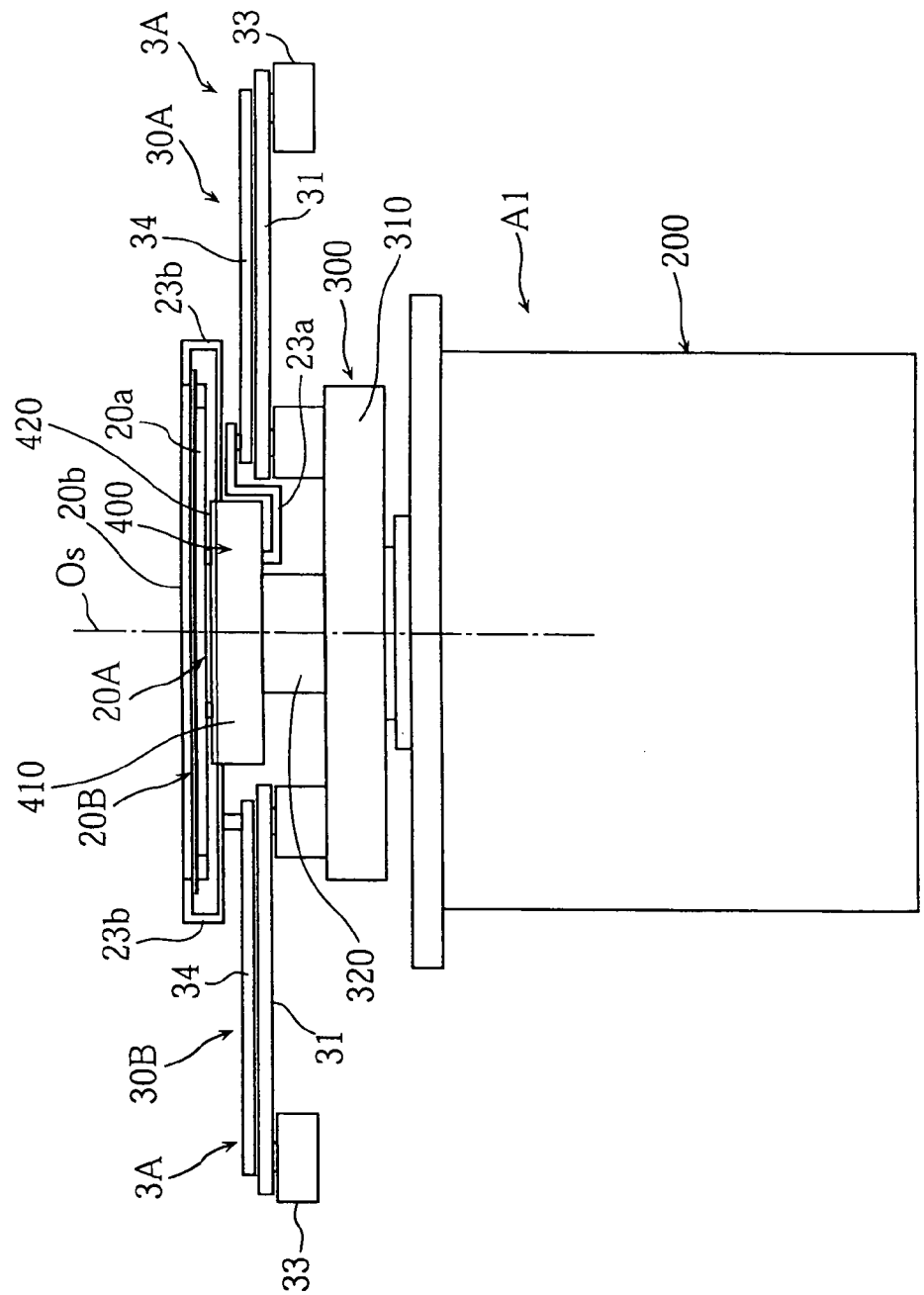
FIG. 20 is a front view of the transfer robot in FIG. 17.

The first drive mechanism 30A and the second drive mechanism 30B have a second link arm 34 which is pivotable around a fifth vertical shaft O5 (which is on a line passing through the third vertical shaft O3 and the fourth vertical shaft O4). As shown in FIG. 22, the second link arm 34 has a base provided with a shaft 34ax, which is supported by the middle link 33 via a bearing 45, making the second link arm 34 pivotable around the fifth vertical shaft O5. Further, as shown in FIG. 22, the middle link 33 has a first gear 31a (which is fixed to the first link arm 31 and in alignment with the third vertical shaft O3) and a second gear 34a (which is fixed to the second link arm 34 in alignment with the fifth vertical shaft O5). The first gear 31a and the second gear 34a are engaged with each other, and their diameters are equal to each other. As shown in FIG. 20, FIG. 21 and others, the second link arm 34 is vertically spaced from the first link arm 31, so they do not interfere with each other.

As shown in FIG. 21, the second link arm 34 has an inner end connected pivotably around a sixth vertical shaft O6 and relatively to each of the moving parts 20A, 20B. Specifically, in the first moving mechanism 30A, the shaft 34ax formed on the connecting arm 24a is pivotably supported via the bearing 45, whereby the inner end of the second link arm 34 is pivotable around the sixth vertical shaft O6 and relatively to the first moving member 20A. On the other hand, in the second moving mechanism 30B, the shaft 34bx formed on one of the supporting arms 23b is pivotably supported via a bearing 46, whereby the inner end of the second link arm 34 is pivotable around the sixth vertical shaft O6 and relatively to the second moving member 20B. The sixth vertical shaft O6 is on a horizontal straight line (a parallel line) passing the first vertical shaft O1 and the second vertical shaft O2 and parallel to the transport path GL. The length of the second link arm 34, i.e. the center-to-center distance between the fifth vertical shaft O5 and the sixth vertical shaft O6, is identical with the length of the first link arm 31, i.e. the center-to-center distance between the first vertical shaft O1 and the third vertical shaft O3.

The first drive mechanism 30A and the second drive mechanism 30B are driven by a motor M3 and a motor M4 respectively, placed in the elevator base 210. As has been described with reference to FIG. 21, the column 301 of the swivel base 300 is formed with a vertical, center through hole 307 which concentrically accommodates a first rotatable transmission shaft 251 and a second rotatable transmission shaft 252. More specifically, the second rotatable transmission shaft 252 is a tubular shaft, and is rotatably supported in the center hole 307 via a bearing 253. Through this second transmission shaft 252, the first rotatable transmission shaft 251 is rotatably supported via a bearing 254. The first rotatable transmission shaft 251 has a lower end connected to an output shaft of the motor M3 supported by the middle wall 213 of the elevator base 210. The second rotatable transmission shaft 252 has a lower end provided with a pulley 255, which is connected, via an endless belt 257, to a pulley 256 on an output shaft of the motor M4 supported by the middle wall 213 of the elevator base 210.

As has been described earlier, the wing portion 310 of the swivel base 300 pivotably supports the base end shaft 31ax of the first link arm 31 via the bearing 41. More specifically, as shown in FIG. 23, a sealing mechanism 330 is placed above the bearing 41, making the inside space of the wing portion 310 airtight against the outside. As has been described earlier, the column 301 of the swivel base 300 is formed with a center hole 307 which supports the first transmission shaft 251 and the second transmission shaft 252. This makes the inside space of the wing portion 310 communicate with the lower space of the elevator base 210, and a combination of the middle link 330, the sealing mechanism 306 provided between the elevator base 210 and the swivel base 300, and the bellows 230 makes a continuous airtight space against the outside, including the inside space of the wing portion 310, inside of the elevator base 210 and the space in the fixed base 200 outside of the bellows 230.

As shown in FIG. 21, the base end shaft 31ax of the first link arm 31 is linked to an output side of a speed reduction mechanism 340 supported in the hollow of the wing portion 310. On the other hand, the second link arm 340 has an input shaft provided with a pulley 341. In the first drive mechanism 30A, a pulley 251a at the upper end of the first rotatable transmission shaft 251 and the input side pulley 341 of the second link arm 340 are connected with an endless belt 342. In the second drive mechanism 30B, a pulley 252a at the upper end of the second rotatable transmission shaft 252 and the input side pulley 341 of the second link arm 340 are connected with an endless belt 343. Thus, the first link arm 31 in the first drive mechanism 30A is pivoted around the first vertical shaft O1 as the motor M3 is driven in normal and reverse directions whereas the first link arm 31 in the second drive mechanism 30B is pivoted around the first vertical shaft O1 as the motor M4 is driven in normal and reverse directions.

Next, description will be made for an overall action of the transfer robot A1 which has the above construction.

Figure 24:
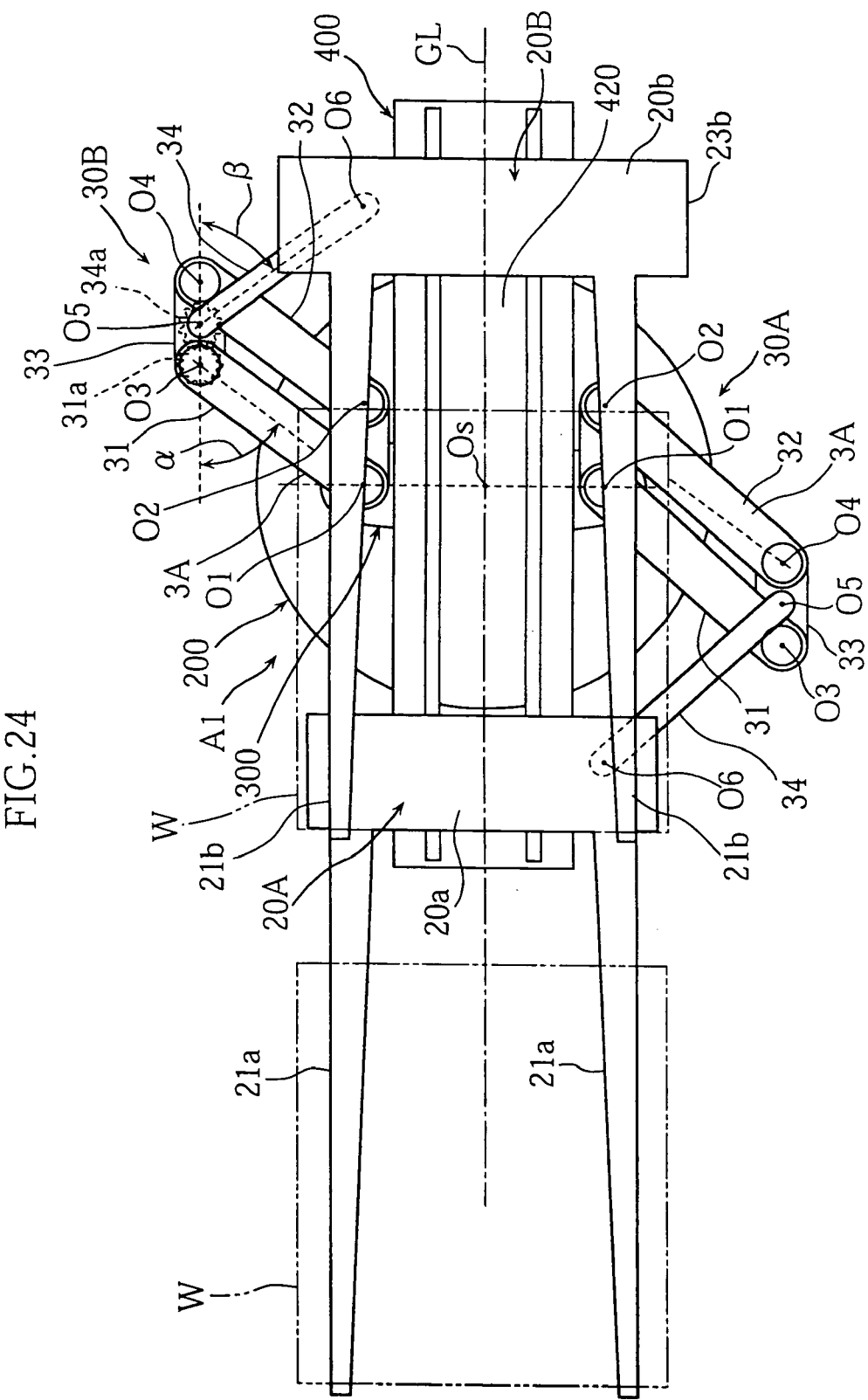
FIG. 24 is a plan view illustrating an action of the transfer robot in FIG. 17.
Figure 25:
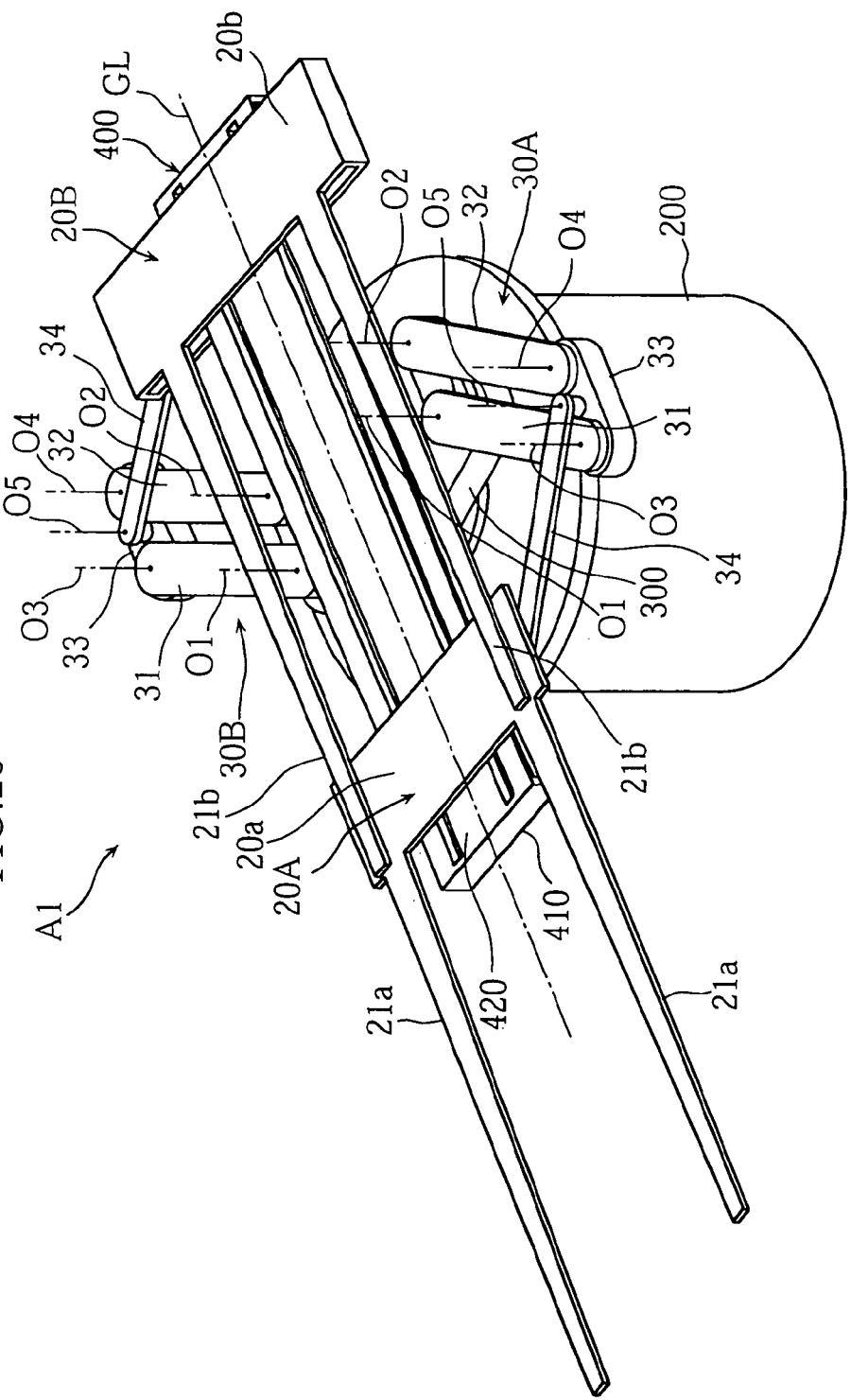
FIG. 25 is a perspective view illustrating an action of the transfer robot in FIG. 17.
Figure 26:
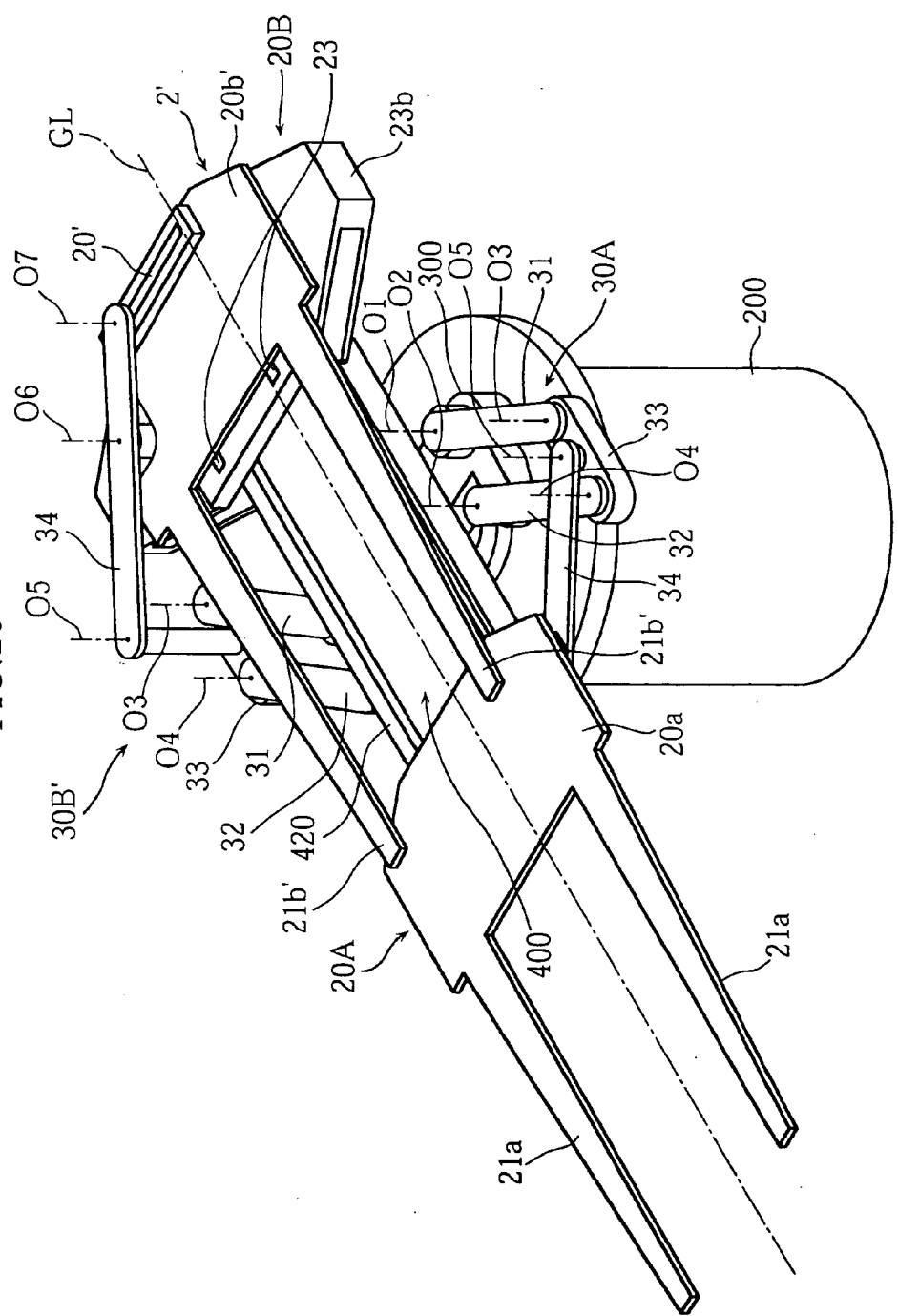
FIG. 26 is a perspective view of a transfer robot according to a seventh embodiment of the present invention.
Figure 27:
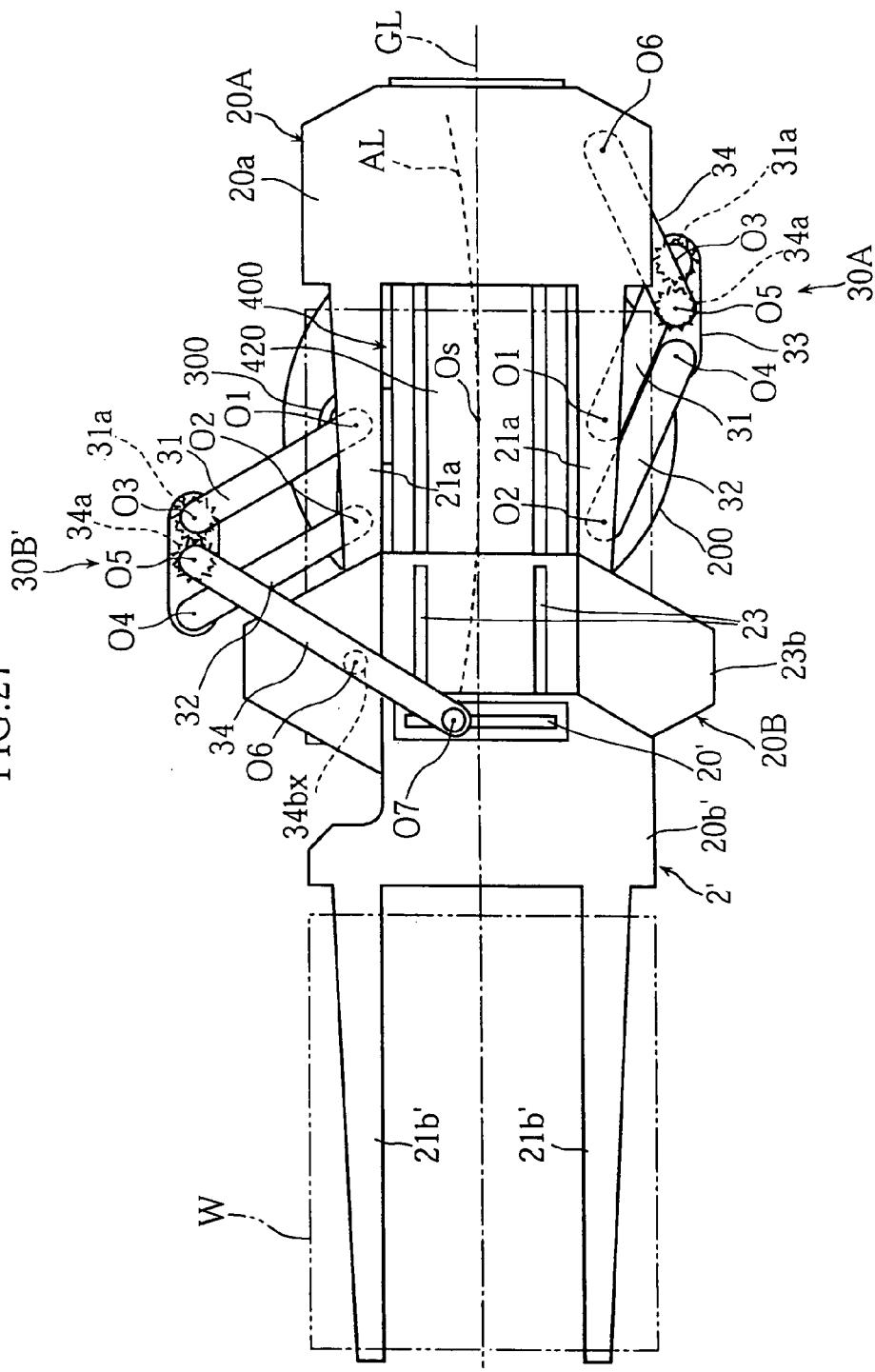
FIG. 27 is a plan view of the transfer robot in FIG. 26.
Figure 28:
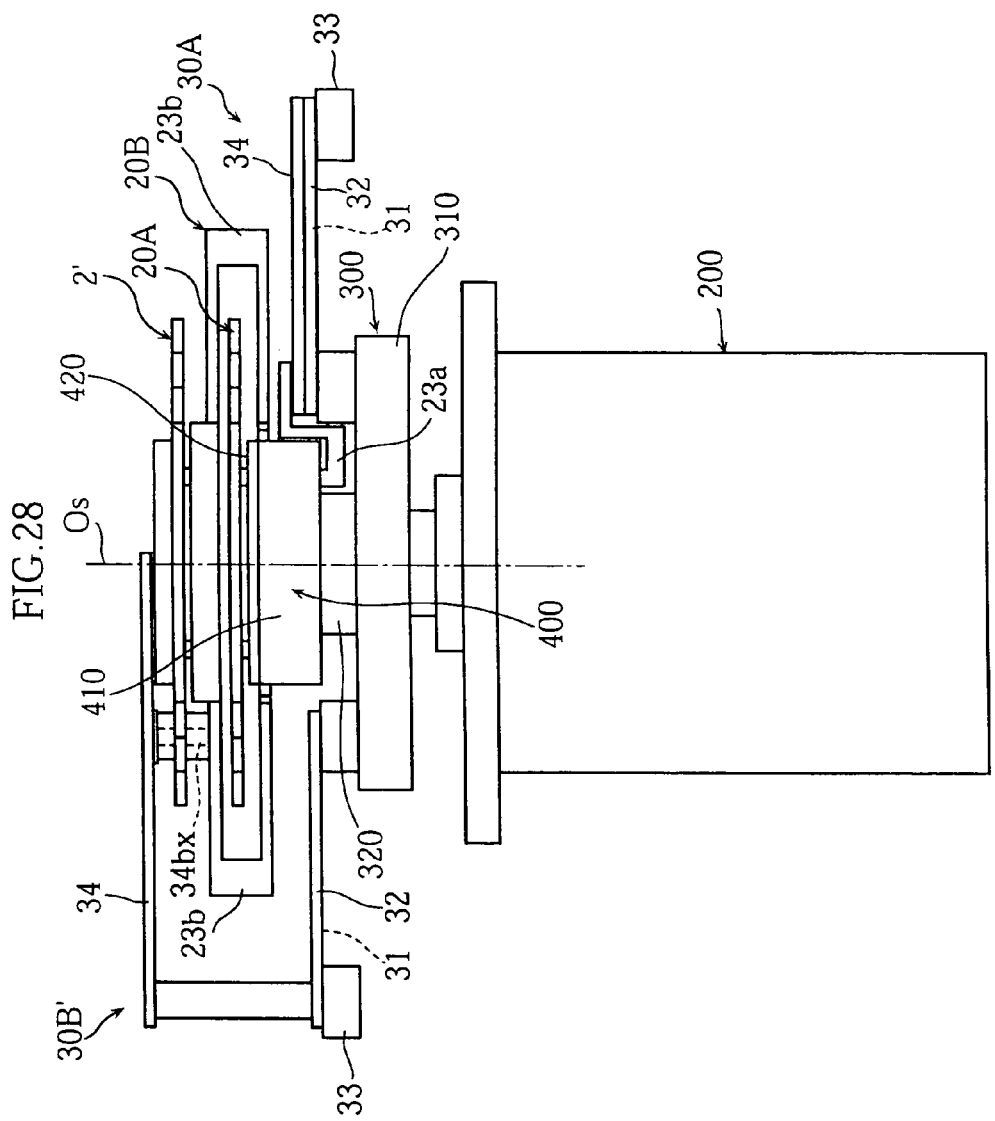
FIG. 28 is a front view of the transfer robot in FIG. 26.

As described earlier, when the first link arm 31 is pivoted around the first vertical shaft O1 in each of the first drive mechanism 30A and the second drive mechanism 30B, the drive mechanism 3A deforms but the orientation of the middle link 33, i.e. a line connecting the third vertical shaft O3 and the fourth vertical shaft O4, is always parallel to the transport path GL of the guide member 410 (See FIG. 24 & FIG. 25). On the other hand, as shown in FIG. 22 and FIG. 24, in the middle link 33, the first gear 31a fixed to the first link arm 31 and the second gear 34a fixed to the second link arm 34 are of the same diameter and they are engaged with each other. Therefore, an angle α made between the first link arm 31 and the middle link 33 and an angle β made between the second link arm 34 and the middle link 33 are always equal to each other (FIG. 24). As has been described earlier, the first link arm 31 and the second link arm 34 are equal in the length, and therefore the line connecting the first vertical shaft O1 and the sixth vertical shaft O6 is always parallel to a line connecting the third vertical shaft O3 and the fifth vertical shaft O5, which means that the first drive mechanism 30A and the second drive mechanism 30B are capable of moving their respective first moving member 20A and the second moving member 20B along the transport path GL of the guide member 410.

In the above embodiment, the first link arm 31 and the second link arm 34 are vertically spaced from each other and thus do not interfere with each other. Therefore, as shown in FIG. 24 and FIG. 25, uninterrupted deformation of the drive mechanism 3A is possible from the state where the first link arm 31 is pivoting around the first vertical shaft O1 toward one longitudinal end of the guide member 410 to the state where it is pivoting toward the other longitudinal end of the guide member 410. As a result, it is possible to move the moving members 20A, 20B all the way along the entire length of the guide member 410. Further, as has been described, the first drive mechanism 30A and the second drive mechanism 30B themselves can move their respective first moving member 20A and second moving member 20B along the horizontal straight path GL. Therefore, it is possible to move the first moving member 20A and the second moving member 20B appropriately even near a so called change point (where the first link arm 31 and the second link arm 34 overlap each other, the states shown in FIG. 17 and FIG. 18).

Also, according to the transfer robot A1, the final straightness in the movement of the first moving member 20A and the second moving member 20B is achieved by the linear movement guide mechanism 400. Further, the weight of the first moving member 20A and the second moving member 20B and the weight of the works placed thereon are essentially supported by the linear movement guide mechanism 400. Therefore, the first drive mechanism 30A and the second drive mechanism 30B may not be very strong, and their construction may not be very accurate, which enables to manufacture of this transfer robot A1 at a low cost.

Further, according to the transfer robot A1 having the construction described above, the first drive mechanism 30A and the second drive mechanism 30B can move their respective first moving member 20A and second moving member 20B individually along their respective horizontal straight paths which is identical with each other in plan view (the transport path GL of the guide member 410). This increases work transportation efficiency remarkably. In the transfer robot A1 according to the present embodiment, the elevator base 210 which supports the swivel base 300 can be raised and lowered with respect to the fixed base 200. This enables to adjust the vertical height of the linear movement guide mechanism 400 appropriately. Further, by pivoting the swivel base 300 around the swivel shaft Os, the linear movement guide mechanism 400 can be appropriately pivoted so that the center axis of the guide member 410 (the transport path GL) is oriented in a desired direction. Further, in the linear movement guide mechanism 400, the prong support 20a of the first moving member 20A and the prong support 20b of the second moving member 20B are spaced vertically from each other without interfering with each other. However, by raising or lowering the elevator base 210, it is also possible to move the prong support 20a of the first moving member 20A and the prong support 20b of the second moving member 20B on exactly the same path in three-dimensional space. This enables for example to receive works W from a given source or to deliver works W to a given destination, using whichever of the first moving member 20A and the second moving member 20B. This further increases work transportation efficiency remarkably.

Further, according to the transfer robot A1, as described above, the space surrounding the bellows 230 in the fixed base 200 which communicates with the inside of the elevator base 210 and the hollow in the wing portion 310 of the swivel base 300 is sealed airtight against the outside. Therefore, the motor M1 and its relevant mechanism for the raising/lowering operation of the elevator base 210, the motor M2 and its relevant mechanism for the swivel operation of the swivel base 300, the motor M3 and its relevant mechanism including the second link arm 340 for the pivoting operation of the first link arm 31 of the first drive mechanism 30A, and the motor M4 and its relevant mechanism including the second link arm 340 for the pivoting operation of the first link arm 31 of the second drive mechanism 30B may be of a low-cost construction which is not for use in vacuum conditions, for the transfer robot A1 to be installed and used in vacuum conditions.

Next, FIG. 26 through FIG. 31 show a transfer robot according to a seventh embodiment of the present invention. It should be appreciated that for this seventh embodiment, elements identical with or similar to those already described especially for the sixth and the fourth embodiments will be identified with the same alphanumerical codes and their description may not be repeated.

As shown in FIG. 26 through FIG. 29, according to the seventh embodiment, the second moving member 20B supports an assisting moving member 2' movably along the transport path GL. The assisting moving member 2' has prongs 21b' and a prong support 20b'. The prong support 20b' is provided with a longitudinal guide groove 20' in a direction across the transport path GL. In the seventh embodiment as the above, the second moving member 20B and the second drive mechanism 30B' have different construction from those in the sixth embodiment. In addition, positional relationship between the first link arm 31 and the assisting link arm 32 is reversed, but the first moving member 20A and the first drive mechanism 30A are the same as in the sixth embodiment. It should be noted that although the positional relationship between the first link arm 31 and the assisting link arm 32 in the present embodiment is reversed from that of the sixth embodiment, the action of the robot is the same as in the sixth embodiment.

Figure 29:
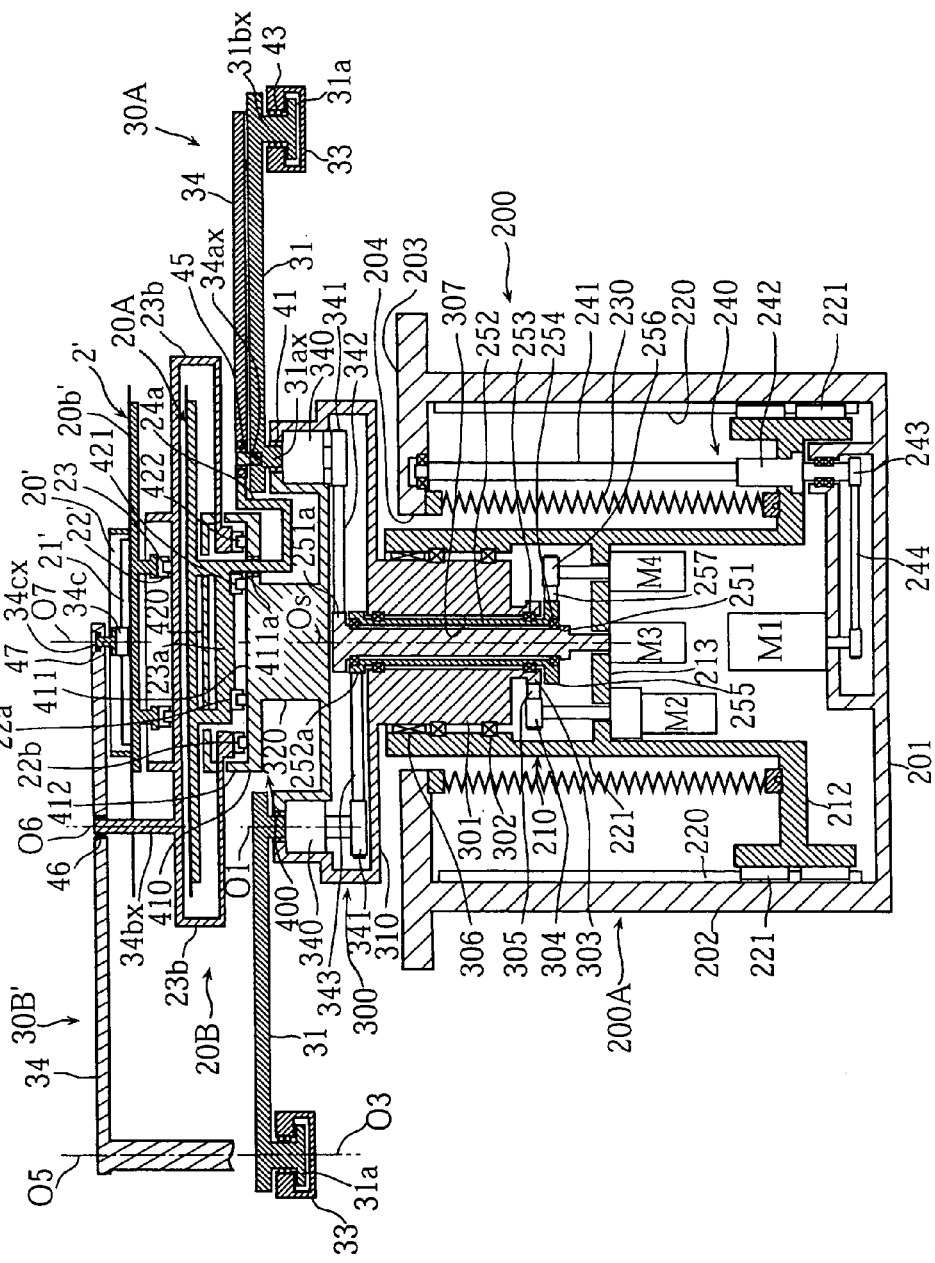
FIG. 29 is a front sectional view of the transfer robot in FIG. 26.

Specifically, as clearly shown in FIG. 29, the second moving member 20B has an upper portion provided with a pair of guide rails 23. These guide rails 23 are placed at the upper portion of the second moving member 20B, spaced by a predetermined distance, sandwiching and in parallel to the transport path GL. The guide rails 23 support the assisting moving member 2' via sliders 22a attached to the bottom of the assisting moving member, for movement along the transport path GL. The second moving member 20B has a pair of supporting arms 23b hanging down from above and extending to detour around the sides. One of the supporting arms 23b is formed with an upwardly protruding shaft 34bx (See FIG. 27 through FIG. 29). The second moving member 20B having such a construction is linked to the second drive mechanism 30B' via the shaft 34bx. On the other hand, the assisting moving member 2' has a guide rail 21' inside the guide groove 20'. The guide rail 21' movably supports the second link arm 34 via a slider 34c of a tip end shaft 34cx (See FIG. 29). In other words, the assisting moving member 2' is also linked to the second drive mechanism 30B' via the tip end shaft 34cx.

The second drive mechanism 30B' includes the first link arm 31, the assisting link arm 32 and the middle link 33 of the same construction as in the sixth embodiment, but the second link arm 34 has a slightly different construction. As shown in FIG. 29, the second link arm 34 is spaced vertically from the first link arm 31 by a fairly large distance, and the two link arms do not interfere with each other. The tip end shaft 34cx is pivotably supported via a bearing 47 around a seventh vertical shaft O7, and thus the tip of the second link arm 34 is pivotable around the seventh vertical shaft O7 relatively to the assisting moving member 2' and movable along the guide groove 20'. The length of the second link arm 34, i.e. the center-to-center distance between the fifth vertical shaft O5 and the seventh vertical shaft O7, is longer than the length of the first link arm 31, i.e. the center-to-center distance between the first vertical shaft O1 and the third vertical shaft O3. However, a center-to-center distance between the fifth vertical shaft O5 and the sixth vertical shaft O6 in the second link arm 34 is equal to the center-to-center distance between the first vertical shaft O1 and the third vertical shaft O3.

As in the sixth embodiment, the first link arm 31 of the second drive mechanism 30B' has a first gear 31a fixed thereto in alignment with the third vertical shaft O3, and the second link arm 34 of the second drive mechanism 30B' has a second gear 34a fixed thereto in alignment with the fifth vertical shaft O5. The first gear 31a and the second gear 34a have the same diameter, and they are engaged with each other. Thus, as the first link arm 31 pivots around the first vertical shaft O1, the second link arm 34 pivots around the fifth vertical shaft O5 in a predetermined direction.

Figure 30A:
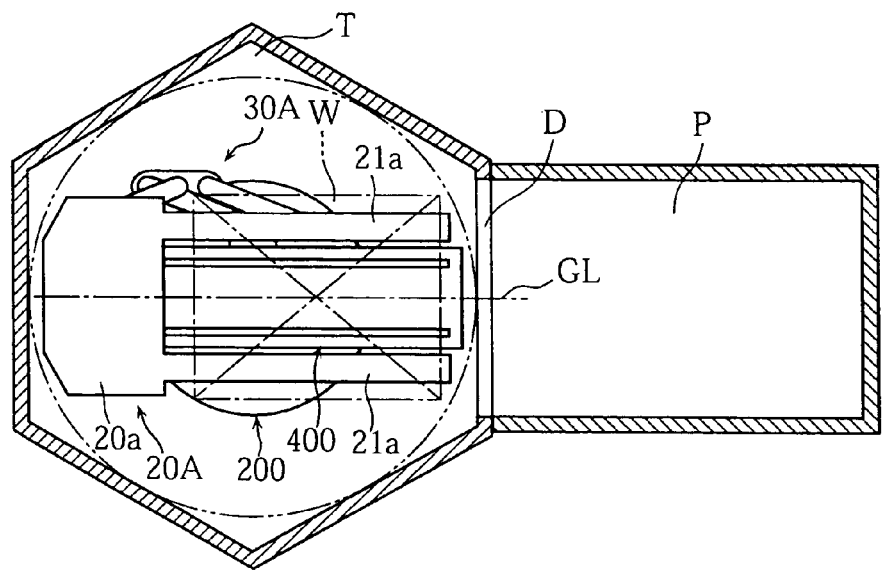
FIGS. 30A and 30B are plan views illustrating an action of the transfer robot in FIG. 26.
Figure 30B:
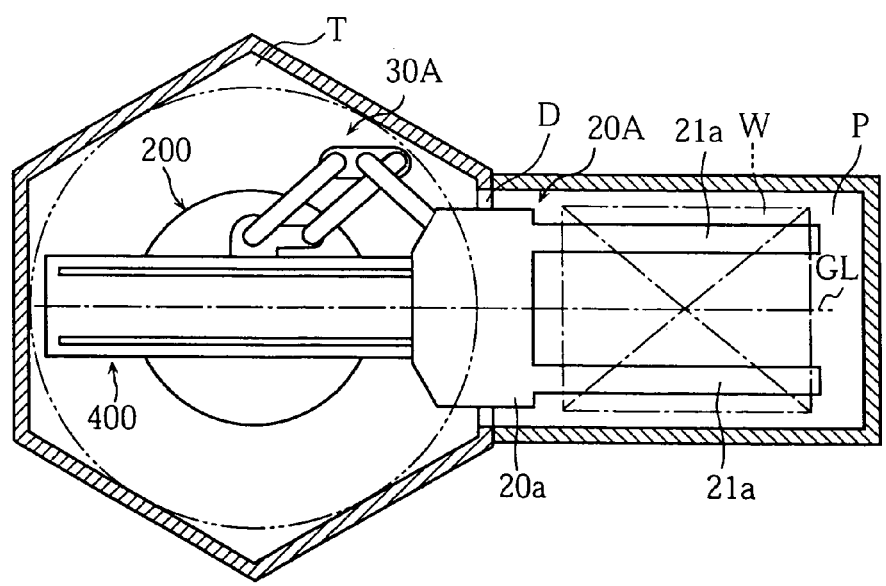
Figure 31A:
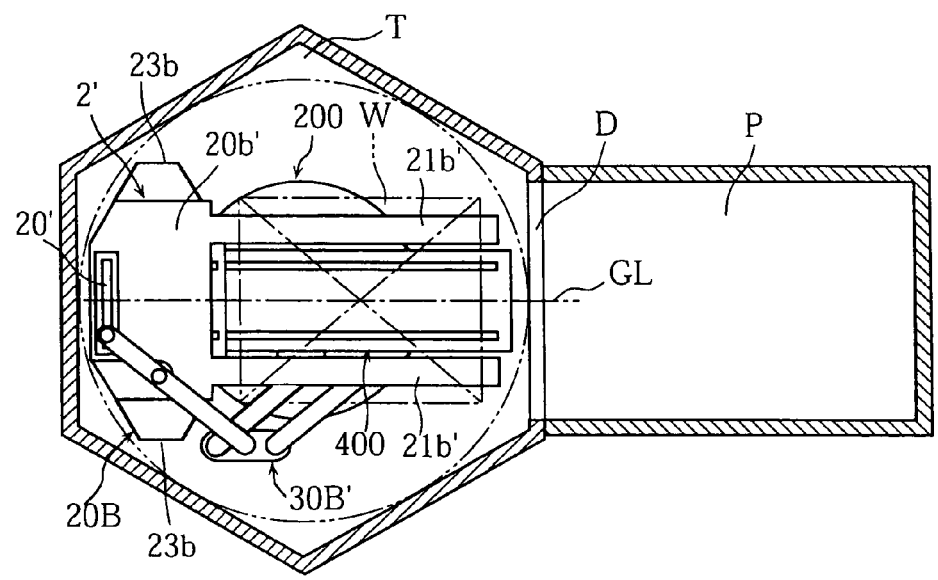
FIGS. 31A and 31B are plan views illustrating an action of the transfer robot in FIG. 26.
Figure 31B:
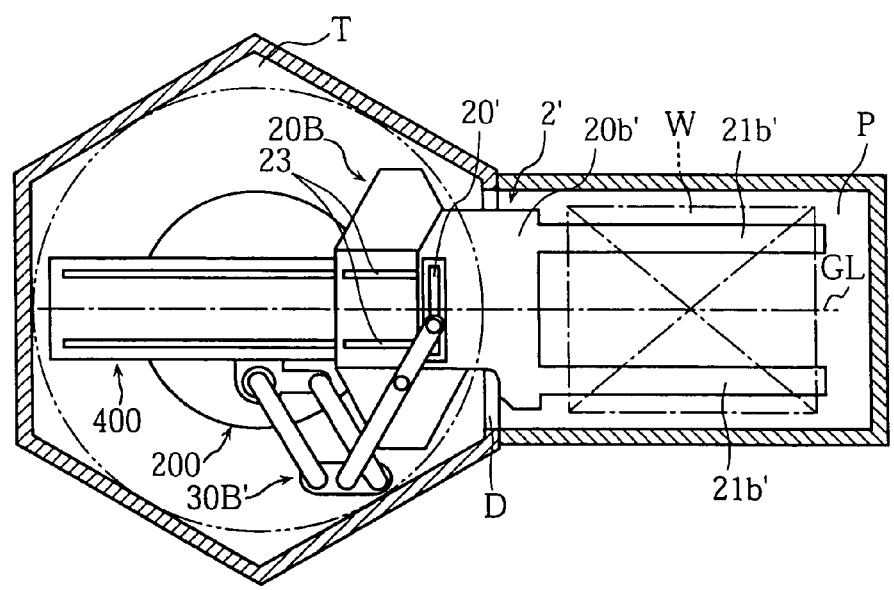

The construction described above provides the same advantages as achieved by the sixth embodiment, and further the same advantages as achieved by the fourth embodiment. In addition, there is still another advantage as follows:

For instance, assume a situation shown in FIGS. 30A through 30B and in FIGS. 31A through 31B, in which a transfer robot of the above-described construction is placed in a transport chamber T. The transport chamber T communicates with a process chamber P via a door D which can be closed and opened. When the door D is opened, the transfer robot in the transport chamber T can move a work W to the process chamber P. It should be noted here that for the sake of depiction, FIGS. 30A through 30B depict the first moving member 20A and the first drive mechanism 30A, and FIGS. 31A through 31B depict the second moving member 20B, the guide groove 20' and the second drive mechanism 30B'.

As shown in FIGS. 30A and 30B, when a work W is moved from the transport chamber T to the process chamber P using the first moving member 20A and the first drive mechanism 30A, the first drive mechanism 30A operates to move the first moving member 20A forward along the transport path GL as described in the sixth embodiment. In this operation, as shown in FIG. 30B, the first moving member 20A has its prongs 21a and part of the prong support 20a extend beyond the door D, into the process chamber P.

On the other hand, as shown in FIGS. 31A and 31B, when a work W is moved from the transport chamber T to the process chamber P using the second moving member 20B, the assisting moving member 2' and the second drive mechanism 30B', the second drive mechanism 30B operates to move the second moving member 20B and the assisting moving member 2' forward along the transport path GL together as described in the fourth embodiment. In this operation, as shown in FIG. 31B, the second moving member 20B has its support arms 23b stretching in both sides of the transport path GL. The interference of the supporting arms 23b with the two sides of the door D stops the movement in front of the door D. However, as for the assisting moving member 2', since the prong support 20b' is narrower than the width of the door D, part of the prong support 20b' moves beyond the door D into the process chamber P, together with the prongs 21b. Thus, even with the double-decker construction of the two moving members 20A, 20B, the work W can be moved to the same position. Further, this enables the door D to be as narrow as possible, which further enables size reduction in the transport chamber T and the process chamber P.

Figure 32:
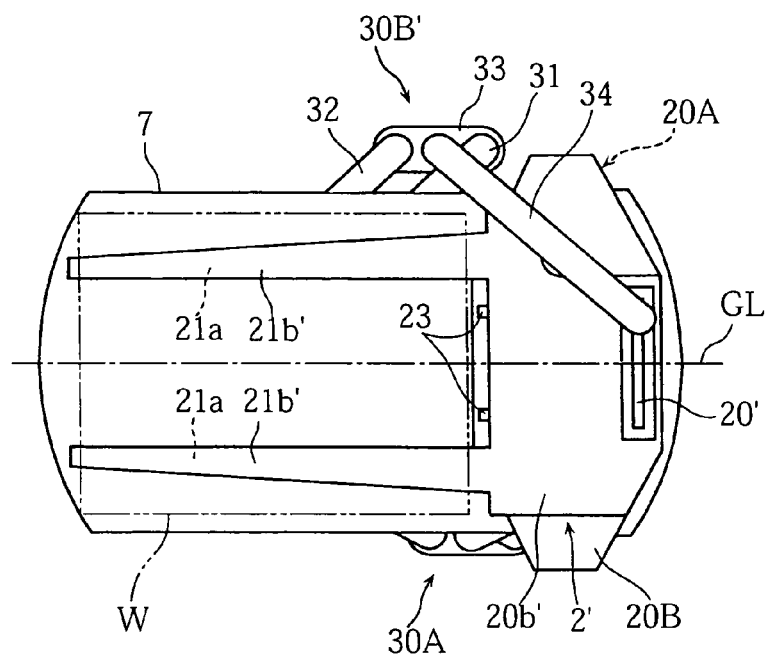
FIG. 32 is a plan view of a transfer robot according to an eighth embodiment of the present invention.
Figure 33:
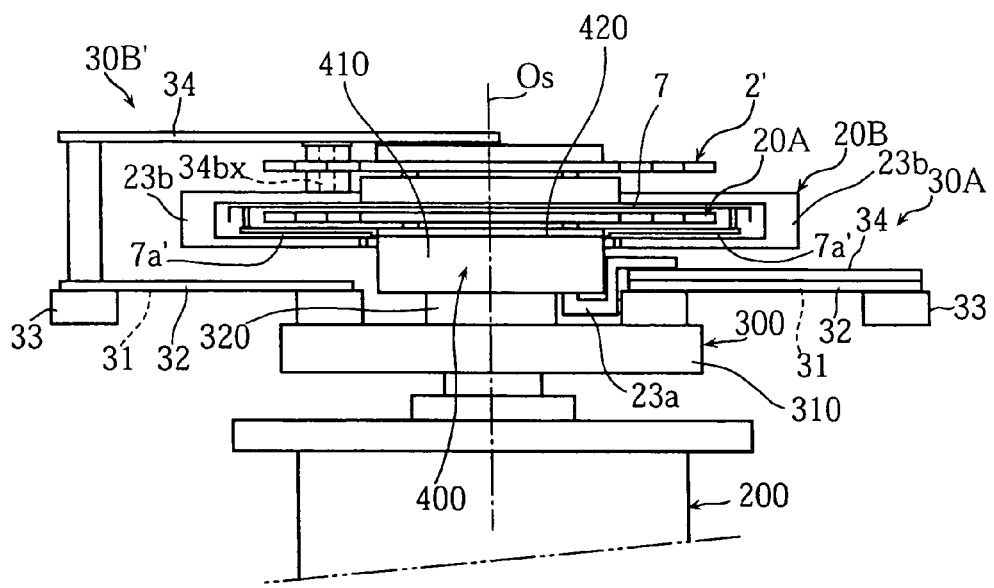
FIG. 33 is a front view of the transfer robot in FIG. 32.

FIG. 32 through FIG. 34 show a transfer robot according to an eighth embodiment of the present invention. It should be appreciated that for the eighth embodiment, elements identical with or similar to those already described especially for the seventh embodiment will be identified with the same alphanumerical codes and their description may not be repeated.

As shown in FIG. 32 and FIG. 33, in the eighth embodiment, a horizontal cover 7 is provided in a gap to be created between the first moving member 20A and the second moving member 20A which are spaced vertically from each over. As shown clearly in FIG. 32, the cover 7 extends from a region where the prongs 21a of the first moving member 20A overlap the prongs 21b' of the assisting moving member 2' to a region where the first moving member 20A overlaps the second moving member 20B, and thus have an area to cover an entire work W. Further, as shown clearly in FIG. 33, the cover 7 is supported by the linear movement guide mechanism 400 via a pair of supporting arms 7a' which extend to detour the sides of the first moving member 20A. In other words, the first moving member 20A is able to move along the transport path GL under the cover 7' whereas the second moving member 20B and the assisting moving member 2' are able to move along the transport path GL above the cover 7'.

Figure 34A:
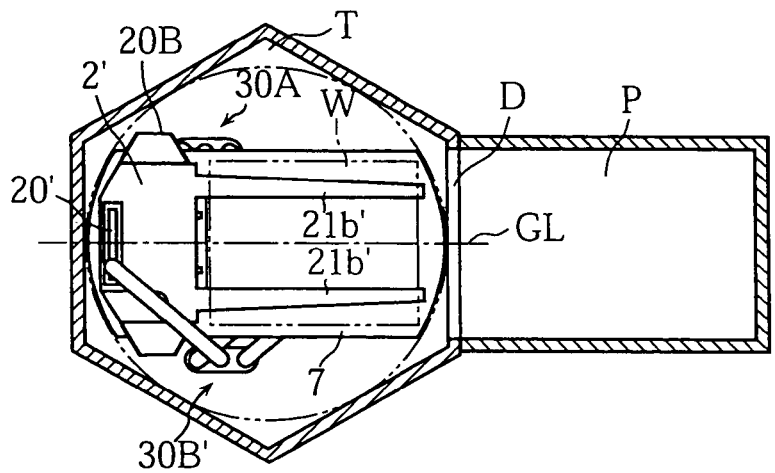
FIGS. 34A through 34C are plan views illustrating an action of the transfer robot in FIG. 32.
Figure 34B:
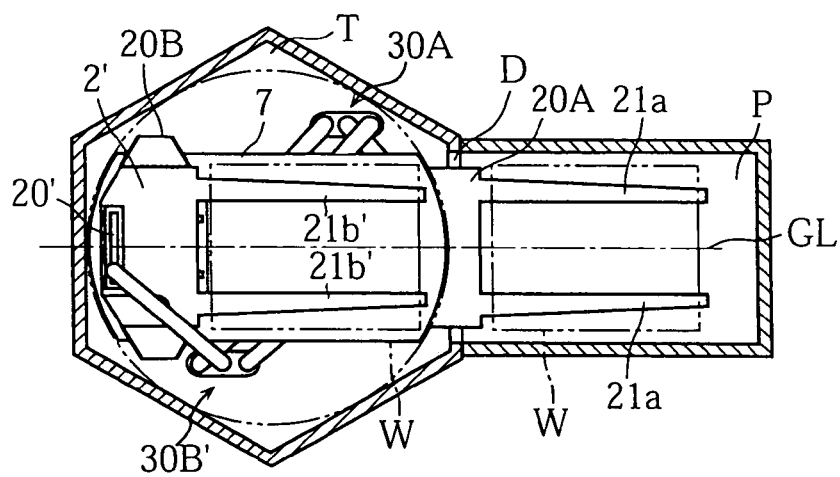
Figure 34C:
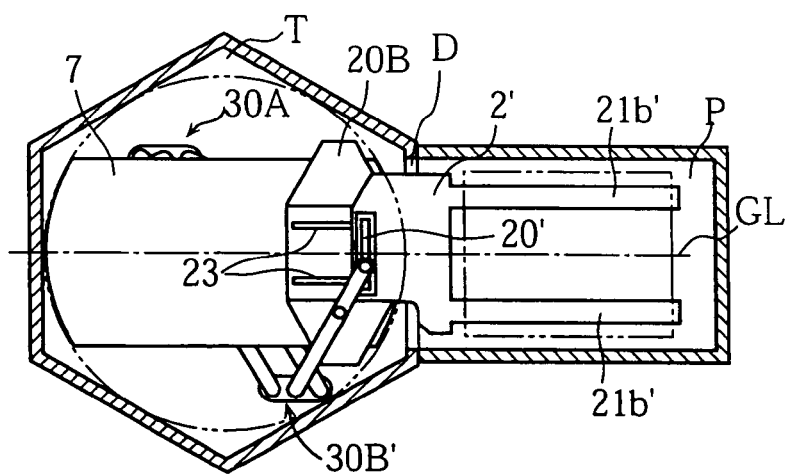
Figure 36:
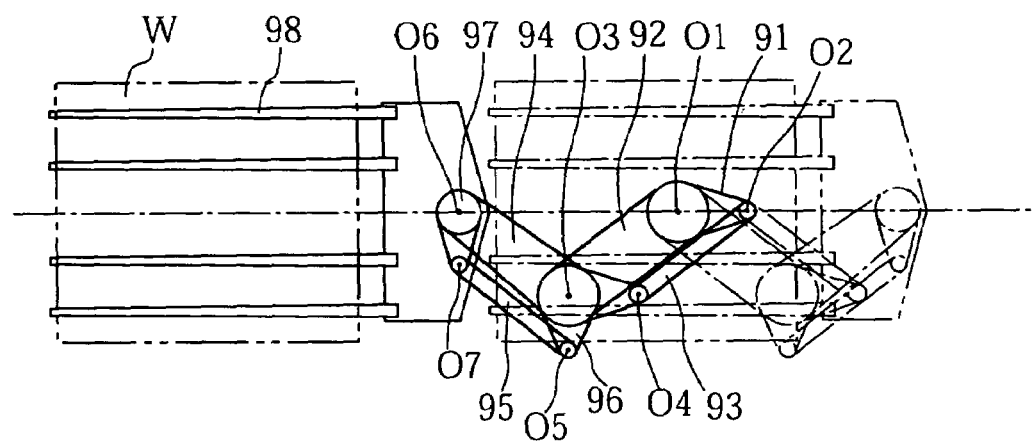
FIG. 36 is a plan view of a transfer robot related to the present invention.

Such a construction provides the following advantages:

For example, as shown in FIGS. 34A and 34B, when a work W is to be moved from a transport chamber T to a process chamber P using the first moving member 20A and the first moving mechanism 30A, the first moving mechanism 30A will be operated as in the seventh embodiment, whereby the first moving member 20A is moved forward along the transport path GL. Likewise, as shown in FIG. 34C, when the work W is to be moved from a transport chamber T to a process chamber P using the second moving member 20B, the assisting moving member 2' and the second moving mechanism 30B', the second moving mechanism 30B'will be operated as in the seventh embodiment, whereby the second moving member 20A and the assisting moving member 2' are moved forward along the transport path GL. When the second moving member 20B and the assisting moving member 2' are moving, the movement of the second moving member 20B and the assisting moving member 2' or the work W placed on the prongs 21b' of the assisting moving member 2' may cause foreign material (particles) to fall out. The foreign material is received by the cover 7. Therefore, the transfer robot according to the present embodiment eliminates potential attachment of the foreign particles particularly to the work W which is placed on the first moving member 20A under the second moving member 20B. Such a cover may also be provided in the robot according to the sixth embodiment.

The present invention is not limited to those modes of embodiment so far described. For example, the first embodiment uses arrays of gears for the operation of the drive mechanism (3, 30A, 30B, 30B'). However, a drive mechanism of this kind may alternatively be operated by a belt-and-pulley system.

The first and the sixth embodiments may be varied by using a drive mechanism of a construction shown in FIG. 35A through FIG. 35C. In the drive mechanism according to this variation, the first gear (31a) is replaced by a first intermittent gear 31a' in alignment with the third vertical shaft O3 on the first link arm 31. Also, the second gear (34a) is replaced by a second intermittent gear 34a' which is in alignment with the fifth vertical shaft O5 on the second link arm 34 and makes temporary engagement with the first intermittent gear 31a'. The first intermittent gear 31a' has a circumference partially formed with a recess 31aa' whereas the second intermittent gear 34a' has a circumference partially formed with a projection 34aa'. As shown in FIG. 35B, the first intermittent gear 31a' and the second intermittent gear 34a' are positioned on the first link arm 31 and the second link arm 34 respectively, so that their recess 31aa' and projection 34aa' will engage with each other near the change point.

According to this variation, as shown in FIG. 35A and FIG. 35C, the recess 31aa' of the first intermittent gear 31a' will not engage with the projection 34aa' of the second intermittent gear 34a' while the moving member (not illustrated) is forwarded or retracted out of a certain distance range from the change point. Yet, when the first link arm 31 pivots around the first vertical shaft (not illustrated) in a predetermined direction, the connecting point of the second link arm 34 and the moving member (the sixth vertical shaft which is not illustrated) is always identical with or parallel to the transport path (not illustrated). Thus, the second link arm 34 pivots in a predetermined direction around the fifth vertical shaft O5, moving the moving member along the transport path. On the other hand, when the moving member is near the change point as shown in FIG. 35B, the recess 31aa' of the first intermittent gear 31a' makes reliable engagement with the projection 34aa' of the second intermittent gear 34a'. Thus, when the first link arm 31 pivots in a predetermined direction around the first vertical shaft near the change point, the second link arm 34 will pivot in a predetermined direction around the fifth vertical shaft O5 and moves the moving member along the transport path. Therefore, the drive mechanism according to the variation shown in FIG. 35 is also capable of moving the moving member smoothly along the transport path from its most advanced position to the most retracted position or vice versa.

The fifth embodiment may also be varied in a similar way using intermittent gears. In this case, the first link arm (31) will have the first intermittent gear (31a') in alignment with the third vertical shaft (O3), and a third intermittent gear in alignment with the eighth vertical shaft (O8). Likewise, the second link arm (34) will have the first intermittent gear (31a') in alignment with the fifth vertical shaft (O5), and a second intermittent gear (34a') which makes temporary engagement with the first intermittent gear (31a'). Further, the third link arm (35) will have a fourth intermittent gear in alignment with the tenth vertical shaft (O10) for temporary engagement with the third intermittent gear. Engagement relationship between gears is the same as has been described.

While the present invention has been described thus far, it is obvious that the present invention can be varied in many other ways. Such variations should not be considered as deviation from the idea and scope of the present invention, but all and any modifications obvious to those skilled in the art should be included in the scope of clams described below.

The invention claimed is:

1. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane;
wherein the guide member includes a plurality of guide rails extending in parallel to the transport path and spaced from each other horizontally, the moving member extending across the transport path to bridge between the guide rails;
wherein the drive mechanism further includes: an assisting link arm pivotable around a second vertical shaft which is different from the first vertical shaft; and a middle link to which the first link arm and the assisting link arm are connected for pivotal movement around a third vertical shaft and a fourth vertical shaft respectively; whereby the first link arm, the assisting link arm and the middle arm provide a parallelogram link mechanism;
the second link arm being connected pivotably to the middle link around a fifth vertical shaft provided on a line passing the third vertical shaft and the fourth vertical shaft, the second link arm being connected pivotably to the moving member around a sixth vertical shaft;
a center-to-center distance between the fifth vertical shaft and the sixth vertical shaft being equal to a center-to-center distance between the first vertical shaft and the third vertical shaft; and
wherein the guide member is provided with a guide groove extending in a direction across the transport path, the sixth vertical shaft being fitted in the guide groove.

2. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane;
wherein the guide member includes a plurality of guide rails extending in parallel to the transport path and spaced from each other horizontally, the moving member extending across the transport path to bridge between the guide rails;
wherein the drive mechanism further includes: an assisting link arm pivotable around a second vertical shaft which is different from the first vertical shaft; and a middle link to which the first link arm and the assisting link arm are connected for pivotal movement around a third vertical shaft and a fourth vertical shaft respectively; whereby the first link arm, the assisting link arm and the middle arm provide a parallelogram link mechanism;
the second link arm being connected pivotably to the middle link around a fifth vertical shaft provided on a line passing the third vertical shaft and the fourth vertical shaft, the second link arm being connected pivotably to the moving member around a sixth vertical shaft; a center-to-center distance between the fifth vertical shaft and the sixth vertical shaft being equal to a center-to-center distance between the first vertical shaft and the third vertical shaft; and
wherein the linear moving mechanism further comprises an assisting moving member supported by the moving member and movable along the transport path, wherein the second link arm is connected pivotably to the assisting moving member around a seventh vertical shaft provided on a line passing the fifth vertical shaft and the sixth vertical shaft, the second link arm being connected to the assisting moving member for movement of the seventh vertical shaft in a direction across the transport path, the pivotal movement of the first link arm around the first vertical shaft moving the seventh vertical shaft along an arc extending generally along the transport path.

3. The linear moving mechanism according to claim 1, further comprising an assisting moving member supported by the moving member and movable along the transport path, wherein the parallelogram link mechanism includes an assisting middle link provided on a more outward side than is the middle link, and connected pivotably to the first link arm and to the assisting link arm around an eighth vertical shaft and a ninth vertical shaft, the assisting middle link connecting to a third link arm, the third link arm being pivotable around a tenth vertical shaft provided on a line passing the eighth vertical shaft and the ninth vertical shaft, the third link arm being connected pivotably to the assisting moving member around an eleventh vertical shaft, a center-to-center distance between the tenth vertical shaft and the eleventh vertical shaft being equal to the center-to-center distance between the first vertical shaft and the eighth vertical shaft.

4. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane;
wherein the guide member includes a plurality of guide rails extending in parallel to the transport path and spaced from each other horizontally, the moving member extending across the transport path to bridge between the guide rails; and
wherein the drive mechanism further includes: an assisting link arm pivotable around a second vertical shaft which is different from the first vertical shaft, and a middle link to which the first link arm and the assisting link arm are connected for pivotal movement around a third vertical shalt and a fourth vertical shaft respectively; whereby the first link arm, the assisting link arm and the middle arm provide a parallelogram link mechanism, the second link arm being connected pivotably to the middle link around a fifth vertical shaft provided on a line passing the third vertical shaft and the fourth vertical shaft, the second link arm being connected pivotably to the moving member around a sixth vertical shaft, the second link arm being connected pivotably to the moving member around a sixth vertical shaft, the sixth vertical shaft being fitted in a guide groove formed on the guide member, the guide groove extending in a direction across the transport path, a center-to-center distance between the fifth vertical shaft and the sixth vertical shaft being longer than the center-to-center distance between the first vertical shaft and the third vertical shaft.

5. The linear moving mechanism according to claim 4, wherein the first link arm has a first gear fixed in alignment with the third vertical shaft, the second link arm having a second gear fixed in alignment with the fifth vertical shaft, the first gear and the second gear having an identical diameter and engaging with each other.

6. The linear moving mechanism according to claim 1, wherein the first link arm has a first intermittent gear fixed in alignment with the third vertical shaft, the second link arm having a second intermittent gear fixed in alignment with the fifth vertical shaft, the first intermittent gear and the second intermittent gear making temporary engagement with each other.

7. The linear moving mechanism according to claim 3, wherein the first link arm has a first gear and a third gear fixed in alignment with the third vertical shaft and the eighth vertical shaft respectively, the second link arm having a second gear fixed in alignment with the fifth vertical shaft, the first gear and the second gear having an identical diameter and engaging with each other, the third link arm having a fourth gear fixed in alignment with the tenth vertical shaft, the third gear and the fourth gear having an identical diameter and engaging with each other.

8. The linear moving mechanism according to claim 3, wherein the first link arm has a first intermittent gear and a third intermittent gear fixed in alignment with the third vertical shaft and the eighth vertical shaft respectively, the second link arm having a second intermittent gear fixed in alignment with the fifth vertical shaft, the first intermittent gear and the second intermittent gear making temporary engagement with each other, the third link arm having a fourth intermittent gear fixed in alignment with the tenth vertical shaft, the third intermittent gear and the fourth intermittent gear making temporary engagement with each other.

9. A transfer robot comprising:

a linear moving mechanism for moving a work along a horizontal straight transport path; and a fixed base supporting the linear moving mechanism, wherein the linear moving mechanism includes: a guide member providing a horizontal straight transport path; a moving member movable along the transport path; and a drive mechanism which drives the moving member, the drive mechanism including a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane, and wherein the linear moving mechanism supported by the fixed base allows the guide member to swivel around a vertical swivel shaft on the transport path, the moving member having a prong on which the work is to be placed.

10. The transfer robot according to claim 9, wherein the linear moving mechanism supported by the fixed base is capable of rising and lowering along the swivel shaft.

11. The transfer robot according to claim 9, wherein the linear moving mechanism is on a swivel base rotatable around the swivel shaft with respect to the fixed base, the moving member including a first moving member and a second moving member supported by the guide member movably along the transport path without interfering with each other, the drive mechanism including a first drive mechanism and a second drive mechanism provided in the swivel base for driving the first moving member and the second moving member respectively.

12. The transfer robot according to claim 11, wherein the first drive mechanism and the second drive mechanism are symmetric with each other with respect to the transport path.

13. The transfer robot according to claim 11, wherein the guide member is provided with a pair of first guide rails and a pair of second guide rails, the first guide rails movably supporting the first moving member and sandwiching the transport path, the second guide rails movably supporting the second moving member and sandwiching the transport path from outside the first guide rails.

14. The transfer robot according to claim 13, wherein each of the first moving member and the second moving member has a prong support supporting a plurality of prongs, the prong support of the second moving member being above the prong support of the first moving member, the second moving member being supported by the second guide rails via a pair of supporting arms extending from two sides of the prong support of the second moving member to detour two sides of the prong support of the first moving member.

15. The transfer robot according to claim 14, wherein the first moving member includes a connecting arm inward of the second guide rails and extending through the guide member, and is connected to the second link arm of the first drive mechanism via the connecting arm, the second moving member being connected to the second link arm of the second drive mechanism in an appropriate region of the supporting arms.

16. The transfer robot according to claim 13, further comprising an assisting moving member supported by the second moving member, wherein each of the first moving member and the assisting moving member has a prong support supporting a plurality of prongs, the prong support of the assisting moving member being above the prong support of the first moving member, the second moving member being supported by the second guide rails via a pair of supporting arms extending from two sides of the prong support of the second moving member to detour two sides of the prong support of the first moving member.

17. The transfer robot according to claim 16, wherein the first moving member includes a connecting arm inward of the second guide rails and extending through the guide member, and is connected to the second link arm of the first drive mechanism via the connecting arm, the second moving member being connected to the second link arm of the second drive mechanism in an appropriate region of the supporting arms, the assisting moving member being connected to the second link arm of the second drive mechanism via a longitudinal guide groove extending in a direction across the transport path.

18. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member via a vertical shaft for pivotal movement of the second link arm in a horizontal plane; and
wherein the guide member is provided with a guide groove extending in a direction across the transport path, the vertical shaft being fitted in the guide groove.

19. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane;
wherein the drive mechanism further includes: an assisting link arm pivotable around a second vertical shaft which is different from the first vertical shalt; and a middle link to which the first link arm and the assisting link arm are connected for pivotal movement around a third vertical shaft and a fourth vertical shaft respectively; whereby the first link arm, the assisting link arm and the middle arm provide a parallelogram link mechanism,
the second link arm being connected pivotably to the middle link around a fifth vertical shaft provided on a line passing the third vertical shaft and the fourth vertical shaft, the second link arm being connected pivotably to the moving member around a sixth vertical shaft, a center-to-center distance between the fifth vertical shaft and the sixth vertical shaft being equal to a center-to-center distance between the first vertical shaft and the third vertical shaft; and
wherein the linear moving mechanism further comprises an assisting moving member supported by the moving member and movable along the transport path, the second link arm being connected pivotably to the assisting moving member around a seventh vertical shaft provided on a line passing the fifth vertical shaft and the sixth vertical shaft, the second link arm being connected to the assisting moving member for movement of the seventh vertical shaft in a direction across the transport path, the pivotal movement of the first link arm around the first vertical shaft moving the seventh vertical shaft along an arc extending generally along the transport path.

20. A linear moving mechanism comprising:
a guide member providing a horizontal straight transport path;
a moving member movable along the transport path; and
a drive mechanism which drives the moving member,
wherein the drive mechanism includes a first link arm pivotable around a first vertical shaft, and a second link arm having a first end and a second end, the first vertical shaft being on the transport path or on a line parallel to the transport path, the first end being connected to the first link arm for pivotal movement of the second link arm in a horizontal plane, the second end being connected to the moving member for pivotal movement of the second link arm in a horizontal plane;
wherein the drive mechanism further includes: an assisting link arm pivotable around a second vertical shaft which is different from the first vertical shaft; and a middle link to which the first link arm and the assisting link arm are connected for pivotal movement around a third vertical shaft and a fourth vertical shaft respectively; whereby the first link arm, the assisting link arm and the middle arm provide a parallelogram link mechanism,
the second link arm being connected pivotably to the middle link around a fifth vertical shaft provided on a line passing the third vertical shaft and the fourth vertical shaft, the second link arm being connected pivotably to the moving member around a sixth vertical shaft, a center-to-center distance between the fifth vertical shaft and the sixth vertical shaft being equal to a center-to-center distance between the first vertical shaft and the third vertical shaft; and
wherein the linear moving mechanism further comprises an assisting moving member supported by the moving member and movable along the transport path, the parallelogram link mechanism including an assisting middle link provided on a more outward side than is the middle link, and connected pivotably to the first link arm and to the assisting link arm around an eighth vertical shaft and a ninth vertical shaft, the assisting middle link connecting to a third link arm, the third link arm being pivotable around a tenth vertical shaft provided on a line passing the eighth vertical shaft and the ninth vertical shaft, the third link arm being connected pivotably to the assisting moving member around an eleventh vertical shaft, a center-to-center distance between the tenth vertical shaft and the eleventh vertical shaft being equal to the center-to-center distance between the first vertical shaft and the eighth vertical shaft.

* * * * *